(12) United States Patent
Tanaka et al.

(10) Patent No.: US 8,748,971 B2
(45) Date of Patent: Jun. 10, 2014

(54) THREE DIMENSIONAL NONVOLATILE SEMICONDUCTOR MEMORY HAVING PILLARS PROVIDED INSIDE AN OBLATE THROUGH HOLE

(71) Applicant: Kabushiki Kaisha Toshiba, Minato-ku (JP)

(72) Inventors: Hiroyasu Tanaka, Tokyo (JP); Hideaki Aochi, Kanagawa-ken (JP); Ryota Katsumata, Kanagawa-ken (JP); Masaru Kidoh, Tokyo (JP); Masaru Kito, Kanagawa-ken (JP); Yoshiaki Fukuzumi, Kanagawa-ken (JP); Yosuke Komori, Kanagawa-ken (JP); Megumi Ishiduki, Kanagawa-ken (JP); Tomoko Fujiwara, Kanagawa-ken (JP); Junya Matsunami, Kanagawa-ken (JP); Ryouhei Kirisawa, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/857,690

(22) Filed: Apr. 5, 2013

(65) Prior Publication Data

US 2013/0228850 A1    Sep. 5, 2013

Related U.S. Application Data

(62) Division of application No. 12/706,127, filed on Feb. 16, 2010, now Pat. No. 8,436,414.

(30) Foreign Application Priority Data

Feb. 17, 2009  (JP) .................................. 2009-033759

(51) Int. Cl.
*H01L 29/792* (2006.01)

(52) U.S. Cl.
USPC .................................. 257/324; 257/E21.614

(58) Field of Classification Search
CPC .................. H01L 27/10841; H01L 27/10864; H01L 27/108

USPC ........................................... 257/324, E21.614
See application file for complete search history.

(56) References Cited

U.S. PATENT DOCUMENTS 6,381,165 B1    4/2002  Lee et al.
6,870,215 B2    3/2005  Endoh et al.
(Continued)

FOREIGN PATENT DOCUMENTS

JP    2003-7866    1/2003
JP    2007-266143    10/2007
(Continued)

OTHER PUBLICATIONS

Office Action issued May 23, 2011 in Korean Patent Application No. 10-2010-13768 (w/English translation).
Office Action mailed Mar. 27, 2013 in Japanese Application No. 2009-033759 filed Feb. 17, 2009 (w/English translation).

*Primary Examiner* — Fernando L Toledo
*Assistant Examiner* — Peter Bradford
(74) *Attorney, Agent, or Firm* — Oblon, Spivak, McClelland, Maier & Neustadt, L.L.P.

(57) ABSTRACT

A nonvolatile semiconductor memory device includes: a semiconductor substrate; a stacked body provided on the semiconductor substrate, the stacked body having electrode films and insulating films being alternately stacked; a first and second semiconductor pillars; and a first and second charge storage layers. The first and second semiconductor pillars are provided inside a through hole penetrating through the stacked body in a stacking direction of the stacked body. The through hole has a cross section of an oblate circle, when cutting in a direction perpendicular to the stacking direction. The first and second semiconductor pillars face each other in a major axis direction of the first oblate circle. The first and second semiconductor pillars extend in the stacking direction. The first and second charge storage layers are provided between the electrode film and the first and second semiconductor pillars, respectively.

17 Claims, 16 Drawing Sheets

(56) References Cited

U.S. PATENT DOCUMENTS

| | | |
|---|---|---|
| 2002/0195668 A1 | 12/2002 | Endoh et al. |
| 2005/0079721 A1* | 4/2005 | Buerger et al. ............... 438/696 |
| 2007/0252201 A1 | 11/2007 | Kito et al. |
| 2008/0002475 A1 | 1/2008 | Yang et al. |
| 2008/0253183 A1 | 10/2008 | Mizukami et al. |
| 2010/0109072 A1 | 5/2010 | Kidoh et al. |
| 2012/0231593 A1* | 9/2012 | Joo et al. ....................... 438/264 |

FOREIGN PATENT DOCUMENTS

| | | |
|---|---|---|
| JP | 2007-317874 | 12/2007 |
| JP | 2008-10868 | 1/2008 |
| KR | 10-2004-0049281 | 6/2004 |
| KR | 10-2008-0092290 | 10/2008 |

* cited by examiner

THREE DIMENSIONAL NONVOLATILE SEMICONDUCTOR MEMORY HAVING PILLARS PROVIDED INSIDE AN OBLATE THROUGH HOLE

CROSS-REFERENCE TO RELATED APPLICATIONS

This application is division of and claims the benefit of priority under 35 U.S.C. §120 from U.S. Ser. No. 12/706,127 filed Feb. 16, 2010, and claims the benefit of priority under U.S.C. §119 from Japanese Patent Application No. 2009-033759 filed Feb. 17, 2009; the entire contents of each of which are incorporated herein by reference.

BACKGROUND OF THE INVENTION

1. Field of the Invention

The invention relates to a nonvolatile semiconductor memory device and a method for manufacturing the same.

2. Background Art

Thus far, nonvolatile semiconductor memory devices such as flash memory have been fabricated by integrating elements two-dimensionally on the surface of a silicon substrate. In order to increase the memory capacity of such flash memories, it is necessary to reduce the dimension of each element to allow downscaling. However, such downscaling is becoming difficult these days in terms of cost and technique.

In order to solve this problem, many methods of integrating elements three-dimensionally are proposed. In particular, a collective patterned three-dimensional stacked memory having high productivity is promising (see JP-A 2007-266143 (Kokai), for example). In this technique, electrode films and insulating films are alternately stacked on a silicon substrate to form a stacked body, and then through holes are formed in the stacked body by collective processing. Subsequently, a charge storage layer is formed on the side surface of the through holes, and silicon is buried in the through holes to form a silicon pillars. Thereby, a memory cell is formed at the intersection of each of the electrode films and the silicon pillar. Further, the end portion of the stacked body is patterned into a staircase shape; an interlayer insulating film is provided around the stacked body so as to overlap the staircase-shaped end portion; and a contact is buried in the interlayer insulating film so as to be connected to the end portion of each of the electrode films. Then, a plurality of metal interconnects are provided above the interlayer insulating film and are each connected to the end portion of each of the electrode films via the contact. Thereby, the electric potential of each of the electrode films can be controlled independently via the metal interconnect and the contact.

In the collective patterned three-dimensional stacked memory, by controlling the electric potentials of each electrode film and each silicon pillar, a charge can be transferred between the silicon pillar and the charge storage layer, and thereby information can be recorded. In this technique, a plurality of electrode films are stacked on the silicon substrate to reduce the chip area per bit, and it allows cost reduction. Furthermore, the three-dimensional stacked memory can be formed by processing the stacked body collectively; therefore, the number of lithography steps does not increase even if the number of stacked layers increases, and an increase in cost can be suppressed.

As one of the examples of the collective patterned three-dimensional stacked memory, a structure in which one semiconductor pillar is divided into two pieces along the extending direction thereof and the divided semiconductor pillars are used as separate memory cells is disclosed (see JP-A 2008-10868 (Kokai), for example). It is conceivable that this structure improves the integration degree. However, there is room for improvement in view of the actual processing accuracy.

SUMMARY OF THE INVENTION

According to an aspect of the invention, there is provided a nonvolatile semiconductor memory device including: a semiconductor substrate; a stacked body provided on the semiconductor substrate, the stacked body having electrode films and insulating films being alternately stacked; a first semiconductor pillar and a second semiconductor pillar provided inside a first through hole penetrating through the stacked body in a stacking direction of the stacked body, the first through hole having a first cross section of a first oblate circle, the first cross section being cut in a direction perpendicular to the stacking direction, the first semiconductor pillar facing the second semiconductor pillar in a first major axis direction of the first oblate circle, the first semiconductor pillar and the second semiconductor pillar extending in the stacking direction; a first charge storage layer provided between the electrode film and the first semiconductor pillar; and a second charge storage layer provided between the electrode film and the second semiconductor pillar.

According to another aspect of the invention, there is provided a method for manufacturing a nonvolatile semiconductor memory device including: forming a stacked body by alternately stacking an insulating film and an electrode film on a substrate; forming a through hole penetrating through the stacked body in a stacking direction of the stacked body, a through hole having a cross section of an oblate circle, the cross section being cut in a direction perpendicular to the stacking direction; burying a semiconductor material in a remaining space of the through hole after forming a layer including a charge storage layer on an inner wall of the through hole; forming a slit dividing the stacked body, the layer including the charge storage layer, and the semiconductor material in a plane including a direction perpendicular to a major axis direction of the oblate circle of the through hole and the stacking direction of the stacked body; form a hole-dividing-insulating-layer made of a insulating material by burying the insulating material in the slit, the insulating material having an etching rate lower than an etching rate of a surface insulating film on a surface above the stacked body; recessing a surface of the surface insulating film by etching the surface insulating film from an upper surface of the hole-dividing-insulating-layer; and burying a conductive material in a space formed by the recessing.

DETAILED DESCRIPTION OF THE INVENTION

Figure 1A:
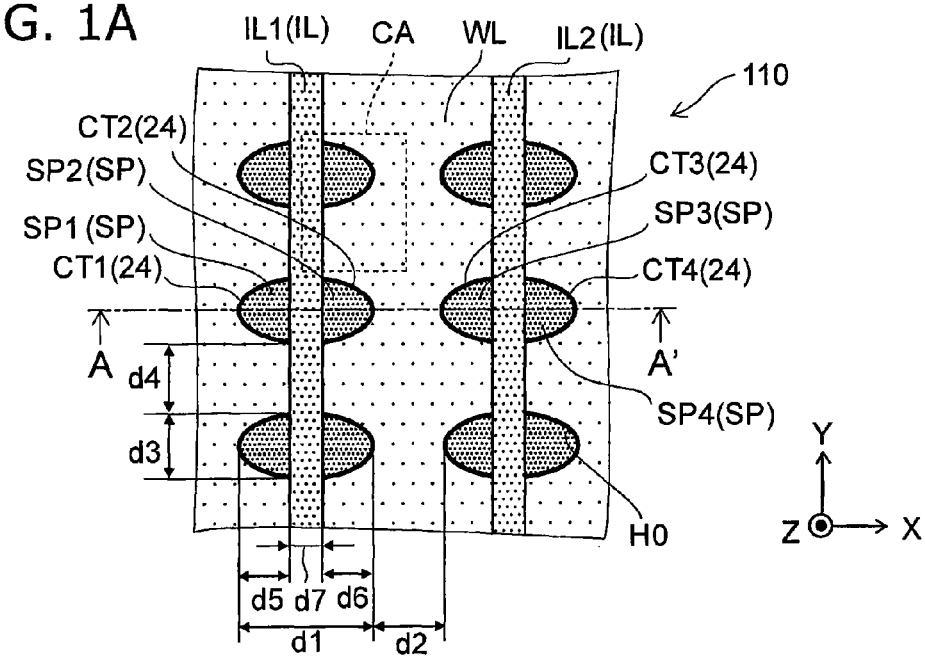
FIGS. 1A and 1B are schematic views illustrating the configuration of a nonvolatile semiconductor memory device according to a first embodiment of the invention.

Embodiments of the invention will now be described with reference to the drawings.

The drawings are schematic or conceptual; and the relationships between the thickness and width of portions, the proportions of sizes among portions, and the like are not necessarily the same as the actual values thereof. Further, the same portion may be shown with different dimensions or ratios depending on the figures.

In the specification and drawings of the application, the same elements as those described previously with reference to earlier figures are labeled with like reference numerals, and the detailed description thereof is omitted as appropriate.

First Embodiment

Figure 1B:
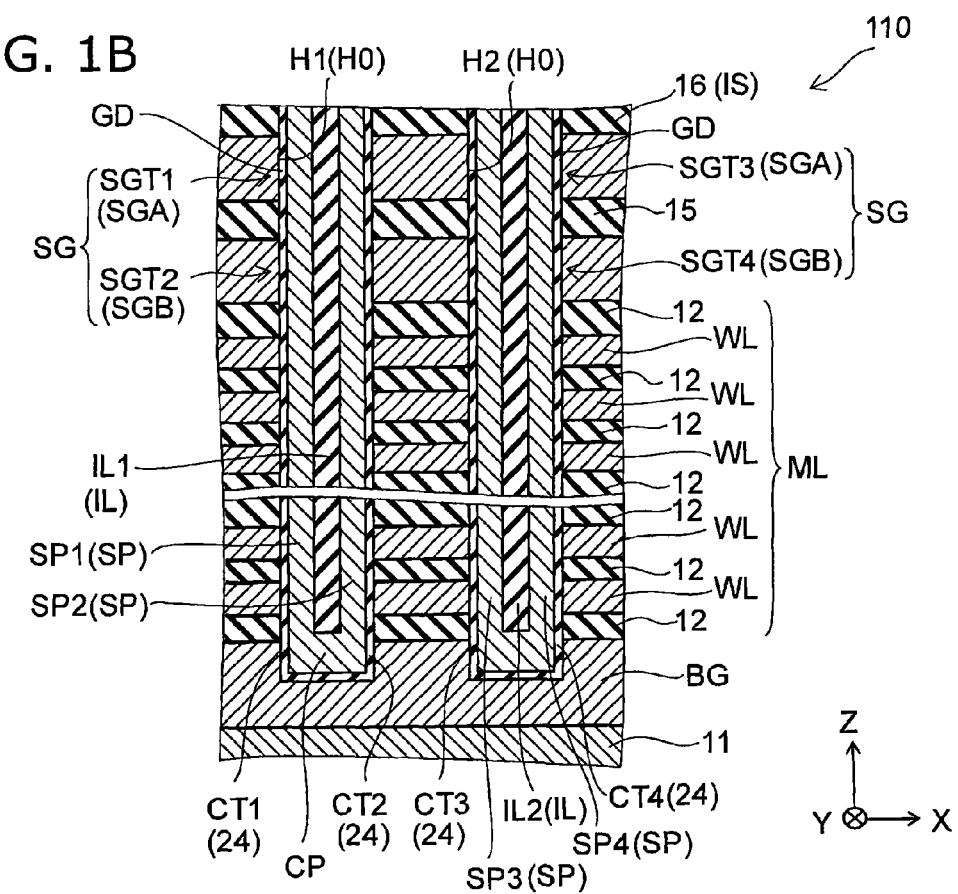

FIGS. 1A and 1B are schematic views illustrating the configuration of a nonvolatile semiconductor memory device according to a first embodiment of the invention.

Specifically, FIG. 1A is a plan view, and FIG. 1B is a cross-sectional view taken along line A-A' of FIG. 1A.

Figure 2:
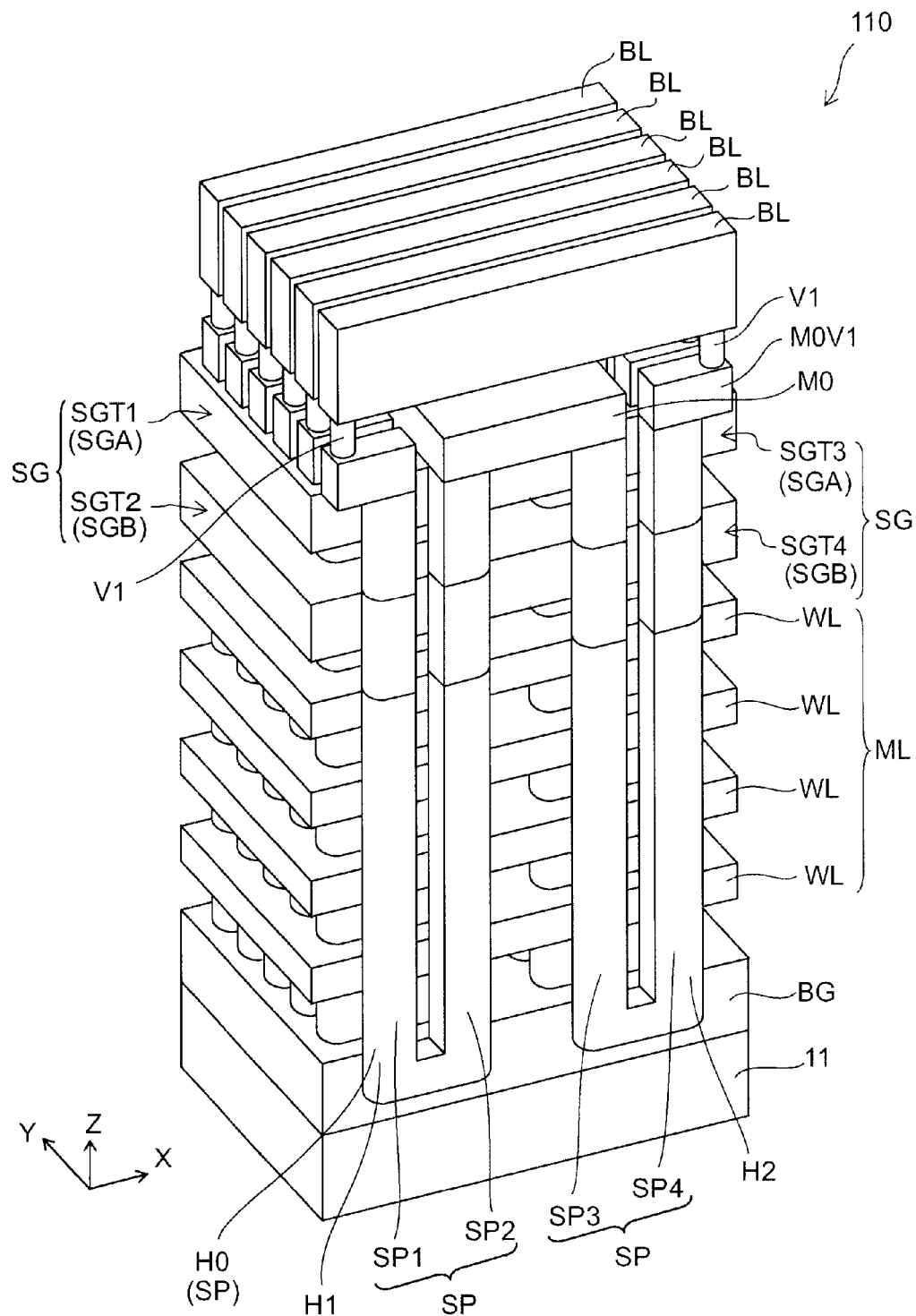
FIG. 2 is a schematic perspective view illustrating the configuration of the nonvolatile semiconductor memory device according to the first embodiment of the invention.

FIG. 2 is a schematic perspective view illustrating the configuration of the nonvolatile semiconductor memory device according to the first embodiment of the invention.

In FIG. 2, to facilitate visualization, only the conductive portions are illustrated, and the illustration of the insulating portions is omitted.

Figure 3:
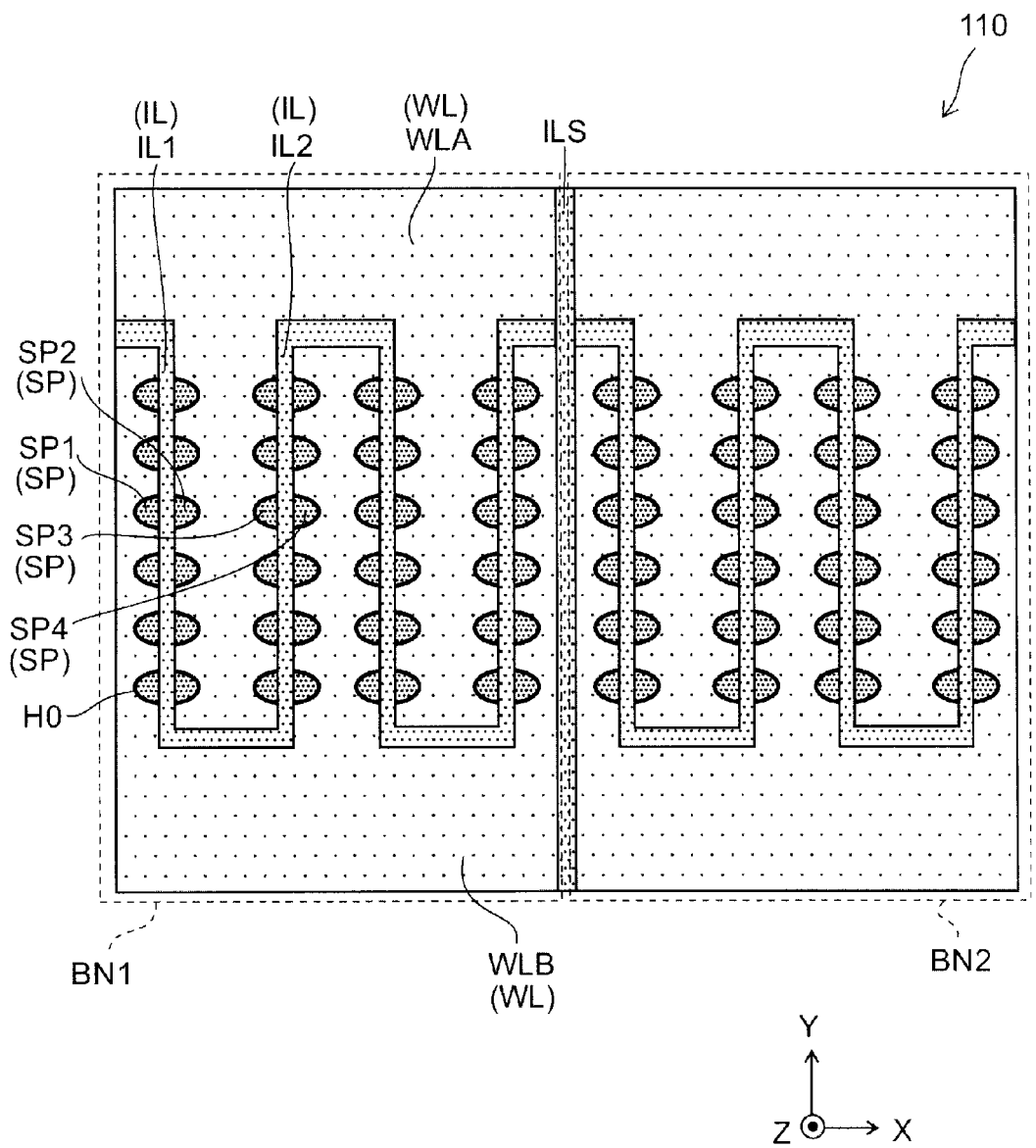
FIG. 3 is a schematic plan view illustrating the configuration of the nonvolatile semiconductor memory device according to the first embodiment of the invention.

FIG. 3 is a schematic plan view illustrating the configuration of the nonvolatile semiconductor memory device according to the first embodiment of the invention.

FIG. 3 illustrates the planar shape of a wider area than FIG. 1A.

As illustrated in FIGS. 1A and 1B, FIG. 2, and FIG. 3, a nonvolatile semiconductor memory device 110 according to the first embodiment of the invention is a flash memory of three-dimensional stack type. As described later, in the nonvolatile semiconductor memory device 110, cell transistors are arranged in a three-dimensional matrix form. Each of the cell transistors includes a charge storage layer. By storing a charge in the charge storage layer, each of the cell transistors functions as a memory cell that memorizes data.

First, the whole configuration of the nonvolatile semiconductor memory device 110 will be briefly described.

As illustrated in FIGS. 1A and 1B and FIG. 2, in the nonvolatile semiconductor memory device 110 according to this embodiment, a semiconductor substrate 11 made of, for example, single-crystal silicon is provided. In the semiconductor substrate 11, a memory array region in which memory cells are formed and a circuit region that drives the memory cells are formed. FIGS. 1A and 1B, FIG. 2, and FIG. 3 illustrate the configuration of the memory array region and omit the circuit region. The semiconductor substrate 11 may be, for example, SOI (silicon on insulator) and the like in addition to single-crystal silicon.

In the memory array region, a back gate BG is provided on the semiconductor substrate 11, and a plurality of insulating films 12 and a plurality of electrode films WL are alternately stacked thereon.

Any conductive material may be used for the electrode film WL. For example, amorphous silicon or polysilicon doped with impurities to have conductivity may be used, and a metal, an alloy, and the like may also be used. A prescribed electric potential is applied to the electrode film WL by a driver circuit (not illustrated) formed in the circuit region, and the electrode film WL functions as a word line of the nonvolatile semiconductor memory device 110.

On the other hand, silicon oxide, for example, is used for the insulating film 12, and the insulating film 12 functions as an interlayer insulating film that insulates the electrode films WL from each other.

A stacked body ML includes the plurality of insulating films 12 and the plurality of electrode films WL mentioned above, which are alternately stacked. The numbers of stacked insulating films 12 and electrode films WL in the stacked body ML are arbitrarily.

A selection gate SG is provided above the stacked body ML. In this specific example, the selection gate SG includes two gates, that is, an upper-layer selection gate SGA and a lower-layer selection gate SGB. Any conductive material may be used for these selection gates SG. For example, polysilicon may be used. An insulating film 15 is provided between the upper-layer selection gate SGA and the lower-layer selection gate SGB. Further, an insulating film 16 is provided on the upper-layer selection gate SGA. Any insulating material may be used for the insulating films 15 and 16. For example, silicon oxide may be used.

In this specific example, the insulating film 16 mentioned above forms a surface insulating film IS disposed on the surface above the stacked body ML. The surface insulating film IS is exposed outward on the surface above the stacked body ML.

Hereinbelow in the specification of the application, for convenience of description, an XYZ orthogonal coordinate system is used. In this coordinate system, two directions parallel to the upper surface of the semiconductor substrate 11 and orthogonal to each other are defined as an X direction and a Y direction, and the direction orthogonal to both the X direction and the Y direction is defined as a Z direction. That is, the stacking direction of the stacked body ML described above constitutes the Z direction.

The selection gate SG is formed by dividing a conductive film along a certain direction. In this specific example, the selection gate SG (the upper-layer selection gate SGA and the lower-layer selection gate SGB) is divided along the X direction. In other words, the selection gate SG forms a plurality of interconnect-form conductive members extending in the Y direction.

In this specific example, as described later, the selection gate SG is provided commonly for a first through hole H1 and a second through hole H2 adjacent to each other in the X direction. A selection gate, which is different from the selection gate SG corresponding to the first through hole H1 and the second through hole H2, corresponds to another through hole H0 that is further adjacent to the first through hole H1 and the second through hole H2 in the X direction. That is, sets of two through holes H0 adjacent to each other in the X direction penetrate through the selection gate extending in the Y direction, in the Z direction.

On the other hand, the electrode film WL is a conductive film parallel to the XY plane and is divided for units of erasing blocks as described later. The electrode film WL also may be divided so as to extend in the Y direction, for example, similar to the selection gate SG.

A plurality of through holes H0 extending in the stacking direction (Z direction) are formed in the stacked body ML and the selection gate SG. The through holes H0 are arranged in a matrix form along the X direction and the Y direction, for example.

In the nonvolatile semiconductor memory device 110 according to this embodiment, the cross section of the through hole H0 has a shape of an oblate circle when cutting with the XY plane. Here, the major axis direction XA of the through hole H0 is assumed to be the X direction. The through hole H0 is divided into two pieces along the minor axis direction (Y direction) of the oblate circle of the through hole H0. Semiconductor pillars SP are provided in the respective insides to face each other in the major axis direction XA of the oblate circle of the through hole H0. A charge storage layer stacked body 24 including a charge storage layer is provided between each of the semiconductor pillars SP and the electrode film WL mentioned above in the inside of the through hole H0. A hole-dividing-insulating-layer IL with a trench shape extending in the Z direction is provided between the two divided semiconductor pillars SP.

In other words, the nonvolatile semiconductor memory device 110 according to this embodiment includes: the semiconductor substrate 11; the stacked body ML provided on the semiconductor substrate 11 the stacked body having electrode films WL and insulating films 12 being alternately stacked; a first semiconductor pillar SP1 and a second semiconductor pillar SP2 provided inside the through hole H0 (first through hole H1) penetrating through the stacked body ML in a stacking direction (Z direction) of the stacked body ML, the through hole H0 (first through hole H1) having a cross section (a first cross section) of an oblate circle (a first oblate circle), the cross section being cut in a direction perpendicular to the stacking direction, the first semiconductor pillar SP1 facing the second semiconductor pillar SP2 in a major axis direction XA (a first major axis direction) of the oblate circle, the first semiconductor pillar SP1 and the second semiconductor pillar SP2 extending in the stacking direction; a first charge storage layer CT1 provided between the electrode film WL and the first semiconductor pillar SP1; and a second charge storage layer CT2 provided between the electrode film WL and the second semiconductor pillar SP2.

The first semiconductor pillar SP1 and the second semiconductor pillar SP2 correspond to the semiconductor pillars SP mentioned above.

The hole-dividing-insulating-layer IL (a first hole-dividing-insulating-layer IL1) is provided between the first semiconductor pillar SP1 and the second semiconductor pillar SP2. Thereby, the first semiconductor pillar SP1 and the second semiconductor pillar SP2 are divided from each other.

In this specific example, the first semiconductor pillar SP1 and the second semiconductor pillar SP2 are electrically connected to each other on a side of the semiconductor substrate 11. That is, the first semiconductor pillar SP1 and the second semiconductor pillar SP2 are electrically connected to each other in the portion of the back gate BG on the side of the semiconductor substrate 11 by, for example, a material (for example a connection portion (CP) that forms the first semiconductor pillar SP1 and the second semiconductor pillar SP2. However, as described later, the first semiconductor pillar SP1 and the second semiconductor pillar SP2 may not be electrically connected to each other but may be independent on the side of the semiconductor substrate 11.

Any semiconductor material may be used for the semiconductor pillar SP (the first and second semiconductor pillars SP1 and SP2). For example, amorphous silicon may be used. Further, polysilicon, for example, may be used for the semiconductor pillar SP. This semiconductor material may or may not be doped with impurities.

The first and second charge storage layers CT1 and CT2 are charge storage layers provided in the charge storage layer stacked body 24 mentioned above. That is, the charge storage layer stacked body 24 may include, for example, a first insulating film, a second insulating film, and the charge storage layer provided between the first and second insulating films. This charge storage layer forms the first and second charge storage layers CT1 and CT2.

A silicon nitride film, for example, may be used for the charge storage layer (the first and second charge storage layers CT1 and CT2). The first insulating film provided between the charge storage layer and the semiconductor pillar SP functions as a tunnel insulating film. The second insulating film provided between the charge storage layer and the electrode film WL functions as a block insulating film. A silicon oxide film, for example, may be used for the first insulating film and the second insulating film. That is, for example, an ONO film (oxide nitride oxide film) may be used for the charge storage layer stacked body 24. However, the embodiment of the invention is not limited thereto. The charge storage layer, the first insulating film, and the second insulating film may be each a single layer or stacked films, and the structure thereof and the material used therefor are arbitrarily. In other words, the charge storage layer stacked body 24 is required to include a layer that stores a charge, and the structure thereof and the material used therefor are arbitrarily.

Thus, in the nonvolatile semiconductor memory device 110, the through hole H0 is configured to have the cross section of an oblate circle shape and two semiconductor pillars are provided in one through hole H0. Thereby, the integration degree of memory cell can be improved while the memory cell is matched with the actual processing accuracy.

A gate insulating film GD is provided between the semiconductor pillar SP, and the upper-layer selection gate SGA and the lower-layer selection gate SGB; a first selection gate transistor SGT1 and a third selection gate transistor SGT3 are provided in the portion of the upper-layer selection gate SGA; and a second selection gate transistor SGT2 and a fourth selection gate transistor SGT4 are provided in the portion of the lower-layer selection gate SGB. Thus, each memory cell can be selected as described later.

Here, a plurality of through holes H0 are provided. Therefore, the whole through holes and one of the through holes are referred to as "through hole H0". Further, when the relationship between the through holes is described, arbitrary one of the plurality of through holes is referred to as a "first through hole H1" and another through hole adjacent to the first through hole H1 in the X direction is referred to as a "second through hole H2".

That is, in the first through hole H1, the first semiconductor pillar SP1 and the second semiconductor pillar SP2 are provided inside the first through hole H1 to face each other in the major axis direction XA of the oblate circle mentioned above, and the first charge storage layer CT1 is provided between the electrode film WL and the first semiconductor pillar SP1 and the second charge storage layer CT2 is provided between the electrode film WL and the second semiconductor pillar SP2. In the first through hole H1, the first hole-dividing-insulating-layer IL1 is provided between the first semiconductor pillar SP1 and the second semiconductor pillar SP2.

The second through hole H2 is provided adjacently to the first through hole H1 in the major axis direction XA of the first through hole H1.

The second through hole H2 penetrates through the stacked body ML in the stacking direction (Z direction) of the stacked body ML and has the cross-section (a second cross-section) of an oblate circle (a second oblate circle) having the major axis direction (a second major axis direction) in a direction parallel to the major axis direction XA when cutting with a plane perpendicular to the stacking direction. A third semiconductor pillar SP3 and a fourth semiconductor pillar SP4 extending in the stacking direction are provided inside the second through hole H2 to face each other in the second major axis direction of the second through hole H2. A third charge storage layer CT3 is provided between the electrode film WL and the third semiconductor pillar SP3, and a fourth charge storage layer CT4 is provided between the electrode film WL and the fourth semiconductor pillar SP4. In the second through hole H2, a second hole-dividing-insulating-layer IL2 is provided between the third semiconductor pillar SP3 and the fourth semiconductor pillar SP4.

Here, for convenience, the second through hole H2 is assumed to be adjacent to the first through hole H1 on the second semiconductor pillar SP2 side of the first through hole H1. The second semiconductor pillar SP2 in the first through hole H1 and the third semiconductor pillar SP3 in the second through hole H2 are adjacent to each other.

As illustrated in FIG. 3, the electrode film WL is divided for each erasing block. In each of erasing blocks BN1 and BN2, the electrode film WL has the shape of, for example, an electrode film WLA and an electrode film WLB that are combined with each other in the shape of comb teeth facing each other in the Y direction. In other words, the electrode film WLA and the electrode film WLB have the configuration of an inter-digital electrode or a multi-finger electrode.

The first hole-dividing-insulating-layer IL1 and the second hole-dividing-insulating-layer IL2 extending in the Y direction are connected to each other in the alternate end portions in the Y direction. Thereby, the electrode films WL are connected as the electrode film WLA at one end in the Y direction, and the electrode films WL are connected as the electrode film WLB at the other end in the Y direction. The electrode film WLA and the electrode film WLB are insulated from each other.

Thus, the electrode film WL is divided in a plane perpendicular to the stacking direction of the stacked body ML, and an electric potential of a portion of the electrode film WL facing the first semiconductor pillar SP1 (for example, the electrode film WLB) can be different from an electric potential of a portion of the electrode film WL facing the second semiconductor pillar SP2 (for example, the electrode film WLA).

The electrode film WL is divided in a plane perpendicular to the stacking direction of the stacked body ML; a portion of the electrode film WL facing the first semiconductor pillar SP1 (for example, the electrode film WLB) and a portion of the electrode film WL facing the fourth semiconductor pillar SP4 (for example, the electrode film WLB) can be set at a first electric potential; and a portion of the electrode film WL facing the second semiconductor pillar SP2 (for example, the electrode film WLA) and a portion of the electrode film WL facing the third semiconductor pillar SP3 (for example, the electrode film WLA) can be set at a second electric potential different from the first electric potential.

Although not illustrated in FIG. 3, the electrode film WLA and the electrode film WLB are electrically connected to a peripheral circuit provided on the semiconductor substrate 11, for example, at both ends in the Y direction. That is, similar to the "staircase configuration" described in JP-A 2007-266143 (Kokai), for example, the length in the Y direction of each electrode film WL (the electrode film WLA and the electrode film WLB) stacked in the Z direction changes in a staircase-like manner; the electrical connection with the peripheral circuit is performed at one end in the Y direction by the electrode film WLA; and the electrical connection with the peripheral circuit is performed at the other end in the Y direction by the electrode film WLB.

Thereby, in electrode films WL equally distant from the semiconductor substrate 11, different electric potentials can be set between the first semiconductor pillar SP1 and the second semiconductor pillar SP2 that form a pair. Furthermore, in electrode films WL equally distant from the semiconductor substrate 11, different electric potentials can be set between the third semiconductor pillar SP3 and the fourth semiconductor pillar SP4. Thereby, the memory cells in the same layer corresponding to the first semiconductor pillar SP1 and the second semiconductor pillar SP2 can operate independently of each other, and the memory cells in the same layer corresponding to the third semiconductor pillar SP3 and the fourth semiconductor pillar SP4 can operate independently of each other.

As illustrated in FIG. 3, a slit insulating layer ILS extending in the Y direction is provided between the erasing blocks so as to divide the erasing blocks BN1 and BN2 from each other, and the electrode films WL (the electrode films WLA and the electrode films WLB) are insulated from each other for the respective erasing blocks.

The configuration illustrated in FIG. 3 is one example. The number in the Y direction and the number in the X direction of through holes H0 disposed in each erasing block and the like, for example, are arbitrarily.

Here, in the nonvolatile semiconductor memory device 110, the diameter (width) of the first through hole H1 in the X direction (major axis direction XA) are denoted by "d1" as illustrated in FIG. 1A. In the X direction of the first through hole H1, the distance from one end of the first through hole H1 to the first hole-dividing-insulating-layer IL1 is denoted by "d5", and the distance from the other end to the first hole-dividing-insulating-layer IL1 is denoted by "d6". The thickness in the X direction (the width in the X direction) of the first hole-dividing-insulating-layer IL1 is denoted by "d7". That is, d1=d5+d6+d7. In this specific example, it is assumed that d5=d6.

On the other hand, the diameter (width) of the first through hole H1 in the Y direction (the minor axis direction) is denoted by "d3".

The through holes H0, including the second through hole H2, other than the first through hole H1 also have a similar cross-sectional shape (planar shape) to the first through hole H1.

On the other hand, in the X direction, the distance between the first through hole H1 and the second through hole H2 is denoted by "d2". Further, in the Y direction, the distance between the first through hole H1 and the other through hole H0 is denoted by "d4".

Here, the minimum feature size in the manufacture of the nonvolatile semiconductor memory device 110 is denoted by "F". At this time, d2, d3, and d4 can be set to F. In the case where a width of 0.5 F is obtained as the finish width by using a method such as slimming, the thickness of the hole-dividing-insulating-layer IL (the first and second hole-dividing-insulating-layers IL1 and IL2) in the X direction can be made 0.5 F. That is, d7 can be made 0.5 F. When d1 that is the diameter of the through hole H0 in the X direction is assumed to be 2 F, d5 and d6 can be made 0.75 F.

Thus, the length (being d1; for example, 2 F) of the first through hole H1 along the major axis direction XA can be set to substantially twice the length (being d3; for example, F) of the first through hole H1 along the minor axis direction (Y direction) orthogonal to the major axis direction XA.

The length (being d5; for example, 0.75 F) of the first semiconductor pillar SP1 along the major axis direction XA and the length (being d6; for example, 0.75 F) of the second semiconductor pillar SP2 along the major axis direction XA can be set to substantially 0.75 times the length (being d3; for example, F) of the first through hole H1 along the minor axis direction.

The distance (being d7; for example, 0.5 F) between the first semiconductor pillar SP1 and the second semiconductor pillar SP2 can be set to substantially 0.5 times the length (being d3; for example, F) of the first through hole H1 along the minor axis direction.

The distance (being d2; for example, F) between the first through hole H1 and the second through hole H2 along the major axis direction XA can be set to substantially equal to the length (being d3; for example, F) of the first through hole H1 along the minor axis direction orthogonal to the major axis direction XA.

Furthermore, the following is applied to another through hole adjacent to the first through hole H1 in the Y direction. That is, the nonvolatile semiconductor memory device 110 may further include: a fifth semiconductor pillar and a sixth semiconductor pillar provided inside a third through hole adjacent to the first through hole H1 in the minor axis direction (Y direction) orthogonal to the major axis direction XA (the first major axis direction), the third through hole penetrating through the stacked body ML in the stacking direction (Z direction), the third through hole having a third cross section of a third oblate circle having a third major axis direction parallel to the major axis direction XA, the third cross section being cut in the direction perpendicular to the stacking direction, the fifth semiconductor pillar facing the sixth semiconductor pillar in the third major axis direction of the third through hole, the fifth semiconductor pillar and the sixth semiconductor pillar extending in the stacking direction; a fifth charge storage layer provided between the electrode film WL and the fifth semiconductor pillar; and a sixth charge storage layer provided between the electrode film WL and the sixth semiconductor pillar.

The distance (being d4; for example, F) between the first through hole H1 and the third through hole along the minor axis direction can be set substantially equal to the length (being d3; for example, F) of the first through hole H1 along the minor axis direction.

In regard to the relationship between d1 and d3, the relationship between d5 and d6, and d3, the relationship between d7 and d3, the relationship between d2 and d3, and the relationship between d4 and d3, a variation within approximately plus or minus 10% is allowable in view of the margin for the manufacture and the like.

As mentioned above, setting each value as above can ensure a width of 0.25 F for the diameter of the first to fourth semiconductor pillars SP1 to SP4 in the X direction, even when the misalignment length in the lithography of the first and second hole-dividing-insulating-layers IL1 and IL2 and each through hole H0 is 0.5 F. Thus, by employing the conditions mentioned above, an appropriate shape can be ensured even when the accuracy of lithography is taken into consideration.

In this case, in one electrode film WL of the stacked body ML, the occupation area CA of one memory cell in the XY plane is (d1+d2)×(d3+d4)/2. In this case, the occupation area CA becomes 3 F×2 F/2=3 $F^2$.

Thus, in the nonvolatile semiconductor memory device 110, a high density of 3 $F^2$ can be achieved.

Comparative Examples

Figure 4A:
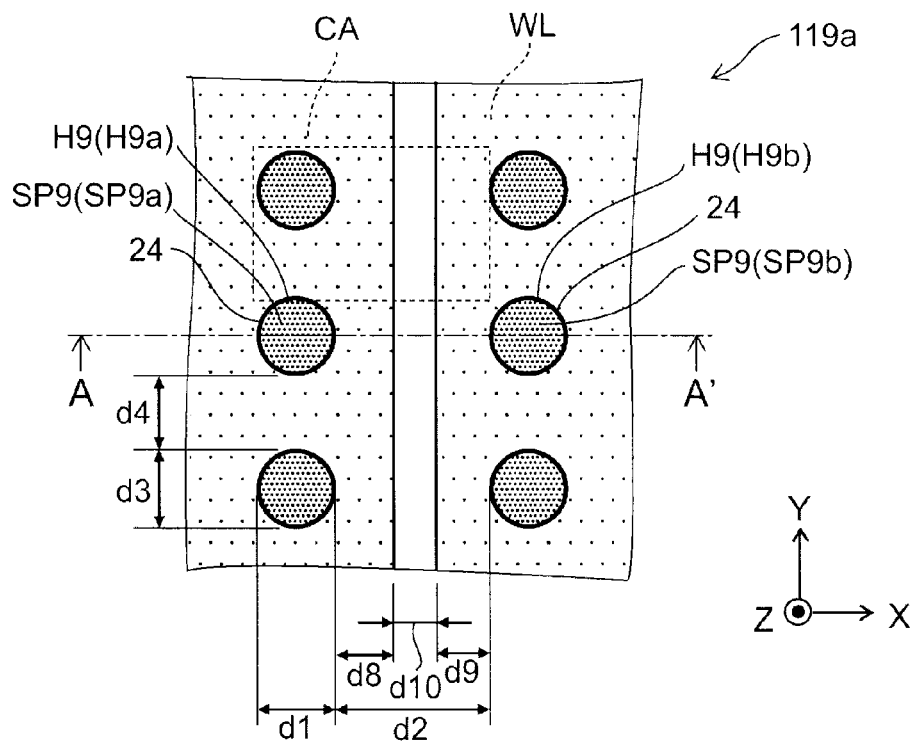
FIGS. 4A and 4B are schematic plan views illustrating the configurations of nonvolatile semiconductor memory devices of comparative examples.
Figure 4B:
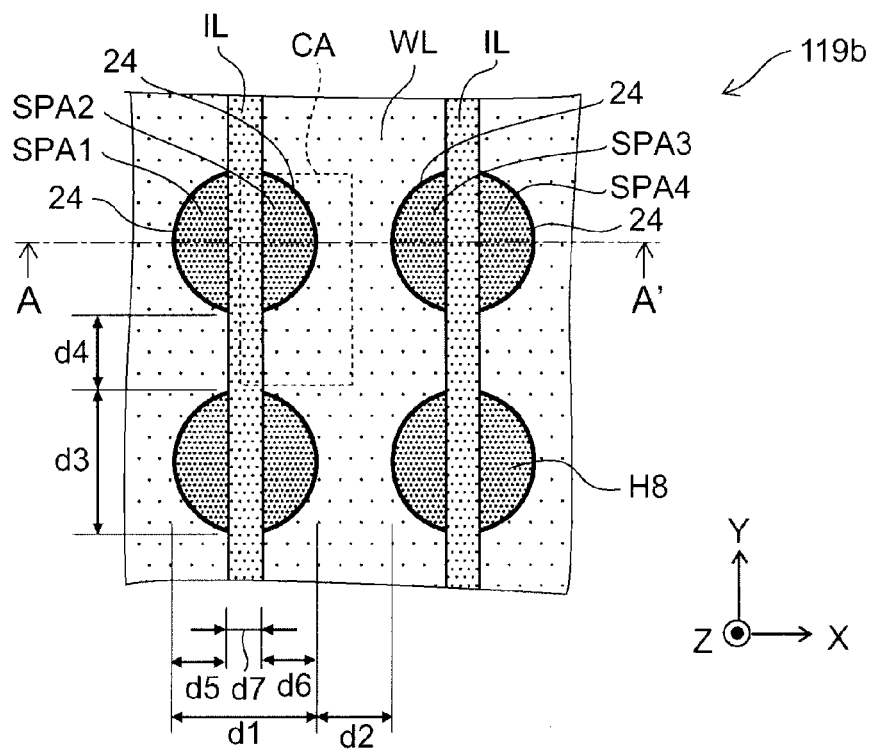

FIGS. 4A and 4B are schematic plan views illustrating the configurations of nonvolatile semiconductor memory devices of comparative examples.

That is, FIGS. 4A and 4B illustrate the configurations of first and second comparative examples.

As illustrated in FIG. 4A, in a nonvolatile semiconductor memory device 119a of the first comparative example, a through hole H9 has a cross-sectional shape of substantially a circle, not an oblate circle. One semiconductor pillar SP9 is provided in the through hole H9, and the through hole H9 is not divided. In the through hole H9, a charge storage layer stacked body 24 is provided between the semiconductor pillar SP9 and the electrode film WL. Respective semiconductor pillars SP9a and SP9b of a through hole H9a and a through hole H9b adjacent in the X direction are connected to each other on a side of the semiconductor substrate 11. In order to select one of the semiconductor pillars SP9a and SP9b adjacent in the X direction, the electrode film WL that forms a word line is divided in between the semiconductor pillars SP9a and SP9b.

The diameter of the through hole H9 is denoted by "d1" (that is, d3). The spacing between the through holes H9 in the X direction is denoted by "d2", and the spacing between the through holes H9 in the Y direction is denoted by "d4".

The spacing between the electrode films WL extending in the Y direction is denoted by "d10". In the X direction, the distances from the through hole H9a and the through hole H9b to the end portions of the electrode films WL are denoted by "d8" and "d9", respectively. That is, d2=d8+d9+d10.

In this case, when the minimum feature size is denoted by "F", d1, d3, and d4 become F. Furthermore, d10 can be made 0.5 F, and d8 and d9 can be made 0.75 F. At this time, the occupation area CA of one memory cell is (d1+d2)×(d3+d4), and in this case the occupation area CA becomes 3 F×2 F=6 $F^2$.

Further, as illustrated in FIG. 4B, in a nonvolatile semiconductor memory device 119b of the second comparative example, a through hole H8 has a cross-sectional shape of substantially a circle, not an oblate circle. Two semiconductor pillars SPA1 and SPA2 are provided in one through hole H8, and the through hole H8 is divided by the hole-dividing-insulating-layer IL. In the through hole H8, a charge storage layer stacked body 24 is provided between each of the semiconductor pillars SPA1 to SPA4 and the electrode film WL. The through hole H8 is divided along the X direction. That is, the semiconductor pillars SPA1 and SPA2 face each other in the X direction. In this case also, the semiconductor pillars SPA1 and SPA2 are connected to each other on a side of the semiconductor substrate 11. A plurality of through holes having a similar structure are provided in a matrix form in the X direction and the Y direction.

That is, in the nonvolatile semiconductor memory device 119b, the planar shape of the through hole H8 is changed into a perfect circle from the nonvolatile semiconductor memory device 110 according to this embodiment.

At this time, the diameter of the through hole H8 is denoted by "d1" (that is, d3), and the spacing between the through holes H8 is denoted by "d2" (that is, d4).

In the X direction, the distance from one end of the through hole H8 to the hole-dividing-insulating-layer IL is denoted by "d5," and the distance from the other end to the hole-dividing-insulating-layer IL is denoted by "d6." The thickness (distance) of the hole-dividing-insulating-layer IL is denoted by "d7." That is, d1=d5+d6+d7, and it is assumed that d5=d6.

In this configuration, when the minimum feature size is denoted by "F", the thickness of the hole-dividing-insulating-layer IL becomes 0.5 F, and d7 becomes 0.5 F. Furthermore, d5 and d6 become approximately 0.75 F. Accordingly, the diameter of the through hole H8 becomes 2 F, d1 and d3 become 2 F, and d2 and d4 become F.

Therefore, in this case, the occupation area CA of one memory cell in the XY plane is (d1+d2)×(d3+d4)/2, and in this case the occupation area CA becomes 3 F×3 F/2=4.5 $F^2$.

In contrast, in the nonvolatile semiconductor memory device 110 according to this embodiment, the through hole H0 is configured to have the cross-sectional shape of an oblate circle. The through hole H0 is divided with a plane parallel to the minor axis direction of the oblate circle. The diameter in a direction parallel to the dividing plane (the diameter in the minor axis direction) can be maintained at F that is the minimum feature size, while the spacing between the divided first and second semiconductor pillars SP1 and SP2 (that is, the width of the hole-dividing-insulating-layer IL) is made a prescribed width.

In other words, the diameter of the through hole H0 in the major axis direction may be made larger than the diameter in the minor axis direction by a length corresponding to the spacing between the divided first and second semiconductor pillars SP1 and SP2 (that is, the width of the hole-dividing-insulating-layer IL); thereby, the occupation area CA of a memory cell can be made as small as possible. For example, in the specific example mentioned above, an occupation area of 3 $F^2$ can be achieved.

The diameter (d1) of the through hole H0 in the major axis direction is preferably not less than 1.5 times and less than 3.0 times the diameter (d3) in the minor axis direction, for example.

Specifically, in the case where the diameter (d1) in the major axis direction is smaller than 1.5 times the diameter (d3) in the minor axis direction, when, for example, d3 is assumed to be F and d7 is assumed to be 0.5 F, d5 and d6 become smaller than 0.5 F, the resistance value of the semiconductor pillar SP increases, the area of the charge storage layer of the charge storage layer stacked body 24 decreases, and the processing becomes difficult.

When the diameter (d1) in the major axis direction is not less than 3.0 times the diameter (d3) in the minor axis direction, the occupation area CA of one memory cell becomes larger than necessary. For example, when the diameter (d1) in the major axis direction is 3.0 times the diameter (d3) in the minor axis direction, the occupation area CA of one memory cell becomes 4 $F^2$. Alternatively, the first through hole H1 and the second through hole H2 adjacent to each other along the X direction overlap each other undesirably.

The diameter (d1) of the through hole H0 in the major axis direction is more preferably substantially twice the diameter (d3) in the minor axis direction, for example. Thereby, the electrical performance, the degree of processing difficulty, and the occupation area can stand together to a high degree.

The spacing between the through holes H0 is preferably the minimum feature size, and is preferably F in both the X direction and the Y direction.

As illustrated in FIG. 1A, in the nonvolatile semiconductor memory device 110, the boundary between the through hole H0 (the first through hole H1 and the second through hole H2) and the electrode film WL is a curved line in the X-Y plane. In other words, no planar portion exists in the boundary between the through hole H0 and the electrode film WL. Thereby, the channel has a curvature in the portion of each memory cell of the semiconductor pillar SP (the first to fourth semiconductor pillars SP1 to SP4).

Thereby, the charge storage layer stacked body 24 has a smaller area on the inner surface than on the outer surface of the through hole H0, and the electric field applied to the charge storage layer stacked body 24 and the channel is stronger on the inner surface side than on the outer surface side. Thereby, an electric field is efficiently applied to the charge storage layer stacked body 24 and the channel, and the performance of the transistor in the memory cell portion is improved.

Thus, in the semiconductor pillar SP (the first to fourth semiconductor pillars SP1 to SP4), the surface on the outer surface side is preferably a curved surface. That is, surfaces other than those on the sides where the first semiconductor pillar SP1 and the second semiconductor pillar SP2 face each other are preferably concave curved surfaces on the sides facing each other.

In other words, the surface of the first semiconductor pillar SP1 along the stacking direction (Z direction) excluding the side facing the second semiconductor pillar SP2 of the first semiconductor pillar SP1 preferably includes a curved surface concave on the side facing the second semiconductor pillar SP2 of the first semiconductor pillar SP1.

Now, in the nonvolatile semiconductor memory device 110, two semiconductor pillars SP (for example, the first and second semiconductor pillars SP1 and SP2) are provided for one through hole H0, and a memory cell is provided at the intersection of each of the semiconductor pillars SP and the electrode film WL. The electrode film WL is continuous between the first through hole H1 and the second through hole H2. That is, in regard to the first through hole H1 and the second through hole H2, the electrode film WL is shared between the first and second semiconductor pillars SP1 and SP2, and the third and fourth semiconductor pillars SP3 and SP4.

As illustrated in FIG. 2, the mutually-proximal second and third semiconductor pillars SP2 and SP3 of the first through hole H1 and the second through hole H2 are connected to a common source line M0. The first and second semiconductor pillars SP1 and SP2, and the third and fourth semiconductor pillars SP3 and SP4 can be selected and driven by the upper-layer selection gate SGA and the lower-layer selection gate SGB.

This configuration will now be described.

Figure 5:
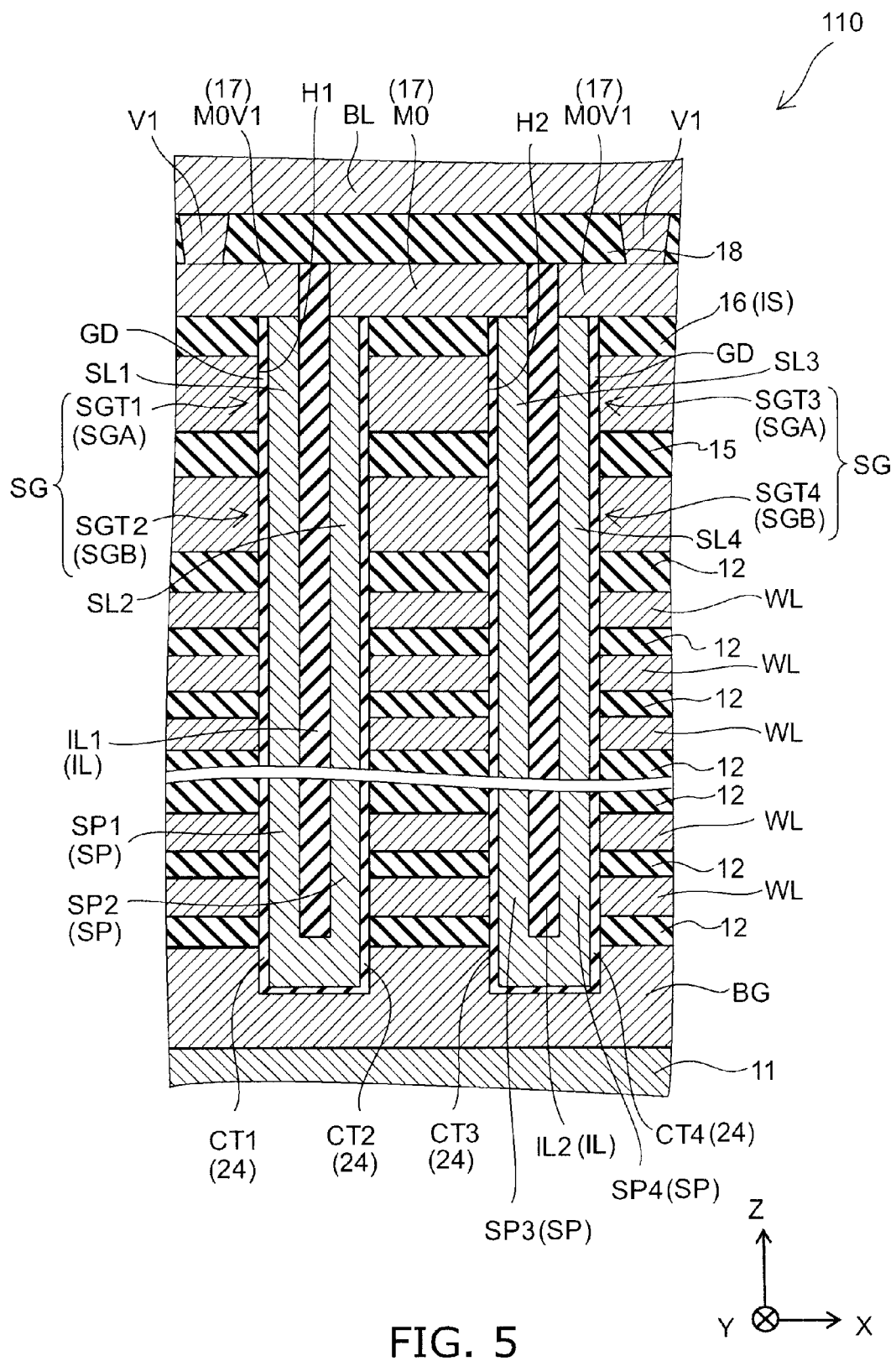
FIG. 5 is a schematic cross-sectional view illustrating the configuration of the nonvolatile semiconductor memory device according to the first embodiment of the invention.

FIG. 5 is a schematic cross-sectional view illustrating the configuration of the nonvolatile semiconductor memory device according to the first embodiment of the invention.

The drawing is a cross-sectional view corresponding to the cross section taken along line A-A' of FIG. 1A.

As illustrated in FIG. 5, in the nonvolatile semiconductor memory device 110, the second semiconductor pillar SP2 on the second through hole H2 side of the first through hole H1 and the third semiconductor pillar SP3 on the first through hole H1 side of the second through hole H2 are connected to the same source line M0 (a metal film 17). In this specific example, the source line M0 is provided to extend in the Y direction.

An insulating film 18 is provided on the source line M0 and a bit line BL is provided on the insulating film 18. In this specific example, the bit line BL is provided to extend in the X direction.

The first semiconductor pillar SP1 on a side of the first through hole H1 opposite to the second through hole H2 is connected to the bit line BL via a connecting section M0V1 formed of the same layer as the source line M0 and a contact via V1.

Similarly, the fourth semiconductor pillar SP4 on a side of the second through hole H2 opposite to the first through hole H1 is connected to the bit line BL via the connecting section M0V1 formed of the same layer as the source line M0 and the contact via V1.

Thus, in the nonvolatile semiconductor memory device 110, the mutually-adjacent semiconductor pillars SP (the second and third semiconductor pillars SP2 and SP3) of the first and second through holes H1 and H2 that are adjacent to each other in the major axis direction XA of the through hole H0 are connected to the common source line M0. The mutually-distant semiconductor pillars SP (the first and fourth semiconductor pillars SP1 and SP4) of the first and second through holes H1 and H2 that are adjacent to each other in the major axis direction XA of the through hole H0 are connected to the common bit line BL. Thereby, the numbers of source lines M0 and bit lines BL can be decreased, and this facilitates the connection of the source line M0 and the bit line BL.

One of the second and third semiconductor pillars SP2 and SP3 connected to the same source line M0, and the first and fourth semiconductor pillars SP1 and SP4 connected to the same bit line BL can be selected by the operation of the upper-layer selection gate SGA and the lower-layer selection gate SGB.

That is, the first and second selection gate transistors SGT1 and SGT2 are provided in the upper-layer and lower-layer selection gates SGA and SGB for the first through hole H1, respectively. The third and fourth selection gate transistors SGT3 and SGT4 are provided in the upper-layer and lower-layer selection gates SGA and SGB for the second through hole H2, respectively. The threshold characteristics are changed between the first selection gate transistor SGT1 and the second selection gate transistor SGT2. Furthermore, the threshold characteristics are changed between the third selection gate transistor SGT3 and the fourth selection gate transistor SGT4.

In other words, in the first to fourth selection gate transistors SGT1 to SGT4, the semiconductor pillars SP form the channels, and they are defined as first to fourth channels SL1 to SL4, respectively. The type of contained impurity and the concentration of doped impurity may be changed between the first channel SL1 and the second channel SL2. Thereby, the threshold characteristics of the first and second selection gate transistors SGT1 and SGT2 can be changed. Similarly, the type of contained impurity and the concentration of doped impurity may be changed between the third channel SL3 and the fourth channel SL4. Thereby, the threshold characteristics of the third and fourth selection gate transistors SGT3 and SGT4 can be changed. Thus, by changing the threshold characteristics, arbitrary semiconductor pillar SP can be selected.

Figure 6:
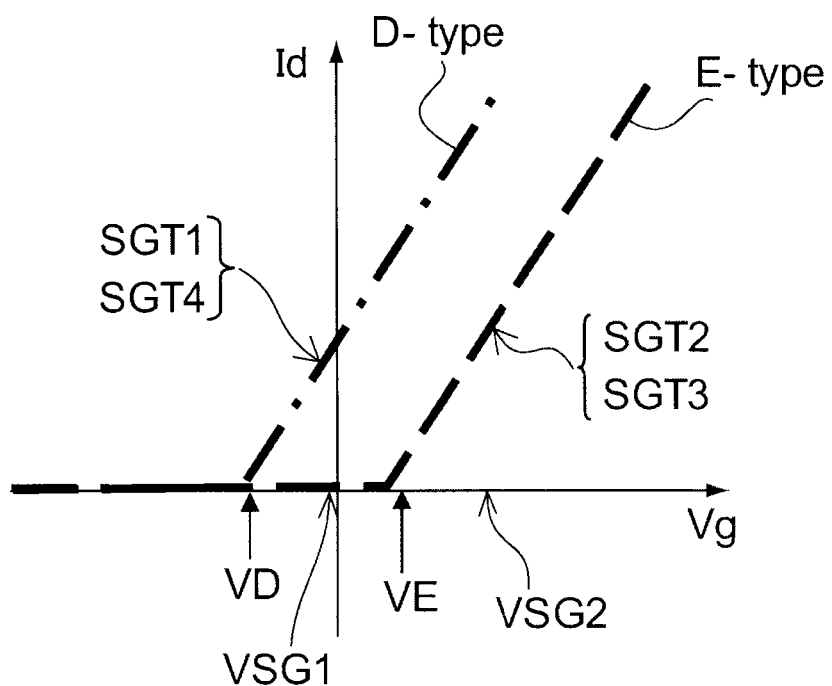
FIG. 6 is a schematic graph chart illustrating characteristics of the nonvolatile semiconductor memory device according to the first embodiment of the invention.

FIG. 6 is a schematic graph chart illustrating characteristics of the nonvolatile semiconductor memory device according to the first embodiment of the invention.

Specifically, the drawing illustrates the threshold characteristics of the first to fourth selection gate transistors SGT1 to SGT4 in the nonvolatile semiconductor memory device 110. The horizontal axis represents the gate voltage Vg, and the vertical axis represents the drain current Id.

As illustrated in FIG. 6, in the nonvolatile semiconductor memory device 110, the first and fourth selection gate transistors SGT1 and SGT4 are configured to be the depression type (D-type), and the second and third selection gate transistors SGT2 and SGT3 are configured to be the enhancement type (E-type).

That is, the threshold voltage VD of the first and fourth selection gate transistors SGT1 and SGT4 is lower than the threshold voltage VE of the second and third selection gate transistors SGT2 and SGT3.

At this time, by applying, for example, a voltage VSG2 that is a higher voltage than the threshold voltage VE to both the upper-layer selection gate SGA and the lower-layer selection gate SGB, the first and second semiconductor pillars SP1 and SP2 are selected.

Furthermore, by applying, for example, a voltage VSG1 that is a lower voltage than the threshold voltage VE to the upper-layer selection gate SGA and applying the voltage VSG2 to the lower-layer selection gate SGB, the third and fourth semiconductor pillars SP3 and SP4 are selected.

Thus, the nonvolatile semiconductor memory device 110 further includes: the third semiconductor pillar SP3 and the fourth semiconductor pillar SP4 provided inside the second through hole H2 adjacent to the first through hole H1 in the major axis direction XA of the first through hole H1, penetrating through the stacked body ML in the stacking direction (Z direction) of the stacked body ML, the second through hole H2 having the cross section of the second oblate circle having the second major axis direction in a direction parallel to the major axis direction XA when cutting with a plane perpendicular to the stacking direction, the third semiconductor pillar SP3 facing the fourth semiconductor pillar SP4 in the second major axis direction of the second through hole H2, the third semiconductor pillar SP3 and the fourth semiconductor pillar SP4 extending in the stacking direction; the third charge storage layer CT3 provided between the electrode film WL and the third semiconductor pillar SP3; and the fourth charge storage layer CT4 provided between the electrode film WL and the fourth semiconductor pillar SP4.

The nonvolatile semiconductor memory device 110 further includes: the first selection gate transistor SGT1 provided at the end portion on a side of the first and second semiconductor pillars SP1 and SP2 opposite to the semiconductor substrate 11; the second selection gate transistor SGT2 provided between the first selection gate transistor SGT1 and the stacked body ML with respect to the first and second semiconductor pillars SP1 and SP2; the third selection gate transistor SGT3 provided at the end portion on a side of the third and fourth semiconductor pillars SP3 and SP4 opposite to the semiconductor substrate 11; and the fourth selection gate transistor SGT4 provided between the third selection gate transistor SGT3 and the stacked body ML with respect to the third and fourth semiconductor pillars SP3 and SP4.

The first and second selection gate transistors SGT1 and SGT2 have thresholds different from each other. The third selection gate transistor SGT3 has the same threshold as the second selection gate transistor SGT2. The fourth selection gate transistor SGT4 has the same threshold as the first selection gate transistor SGT1.

Here, "the same threshold" is not limited to a strictly equal threshold but may include a variation caused by, for example, variations in process conditions, and it requires a substantially equal threshold.

Thereby, one of the second and third semiconductor pillars SP2 and SP3 that share the selection gate SG and are connected to the common source line M0 can be distinctly selected. Furthermore, one of the first and fourth semiconductor pillars SP1 and SP4 that share the selection gate SG and are connected to the common bit line BL can be distinctly selected.

An example of the method for manufacturing the nonvolatile semiconductor memory device 110 will now be described.

FIGS. 7A to 7D are schematic sequential views illustrating a method for manufacturing the nonvolatile semiconductor memory device according to the first embodiment of the invention.

Figure 7A:
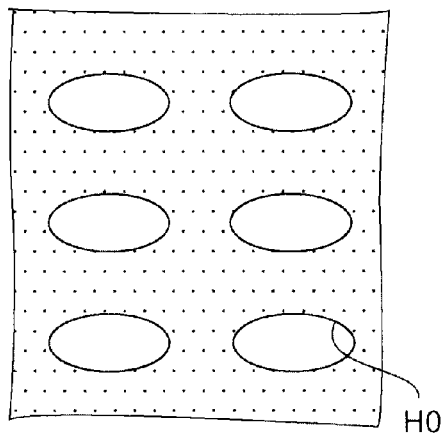
FIGS. 7A to 7D are schematic sequential process plan views illustrating a method for manufacturing the nonvolatile semiconductor memory according to the first embodiment of the invention.
Figure 7B:
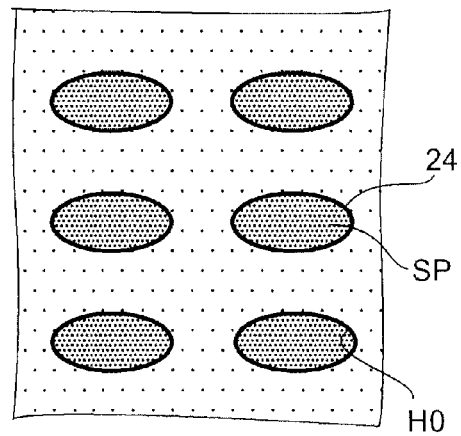
Figure 7C:
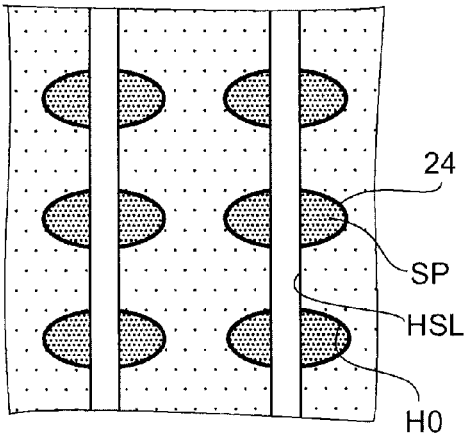
Figure 7D:
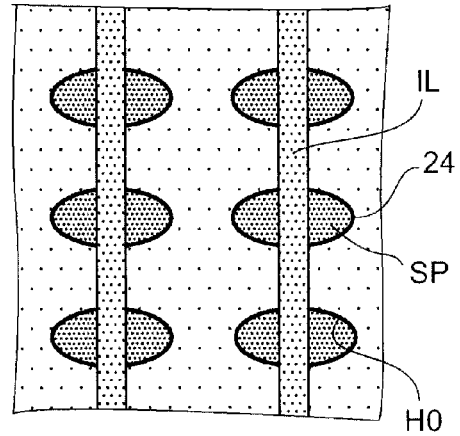

Specifically, FIG. 7A is a schematic plan view of the first process, and FIGS. 7B to 7D are schematic plan views continuing from the respective previous processes.

FIGS. 8A to 8D are schematic plan views continuing from FIG. 7D.

Figure 8A:
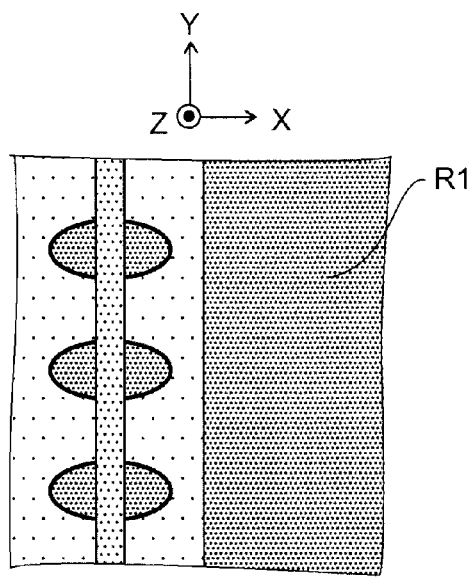
FIGS. 8A to 8D are schematic plan views illustrating a method for manufacturing the nonvolatile semiconductor memory according to the first embodiment of the invention continuing from FIG. 7D.
Figure 8B:
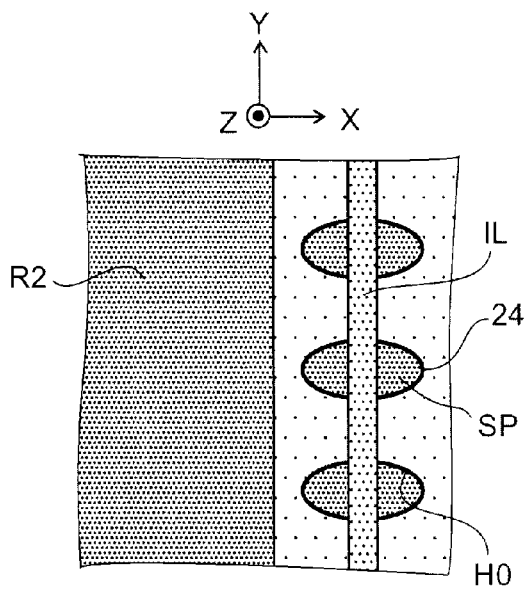
Figure 8C:
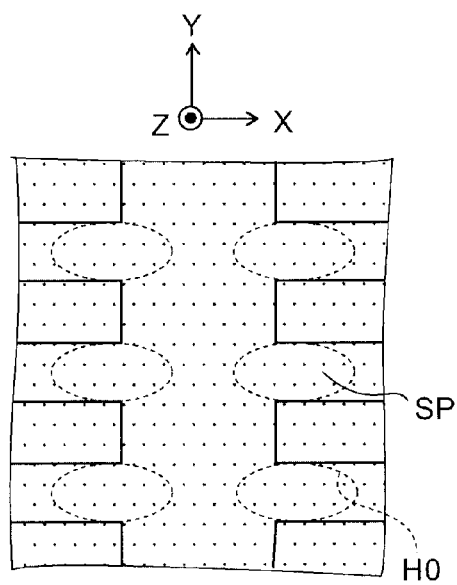
Figure 8D:
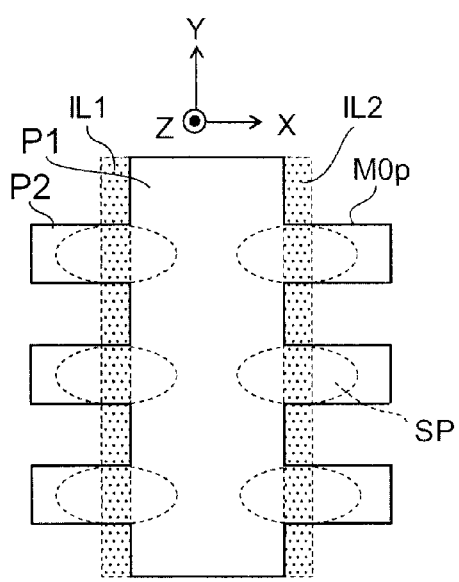
Figure 9A:
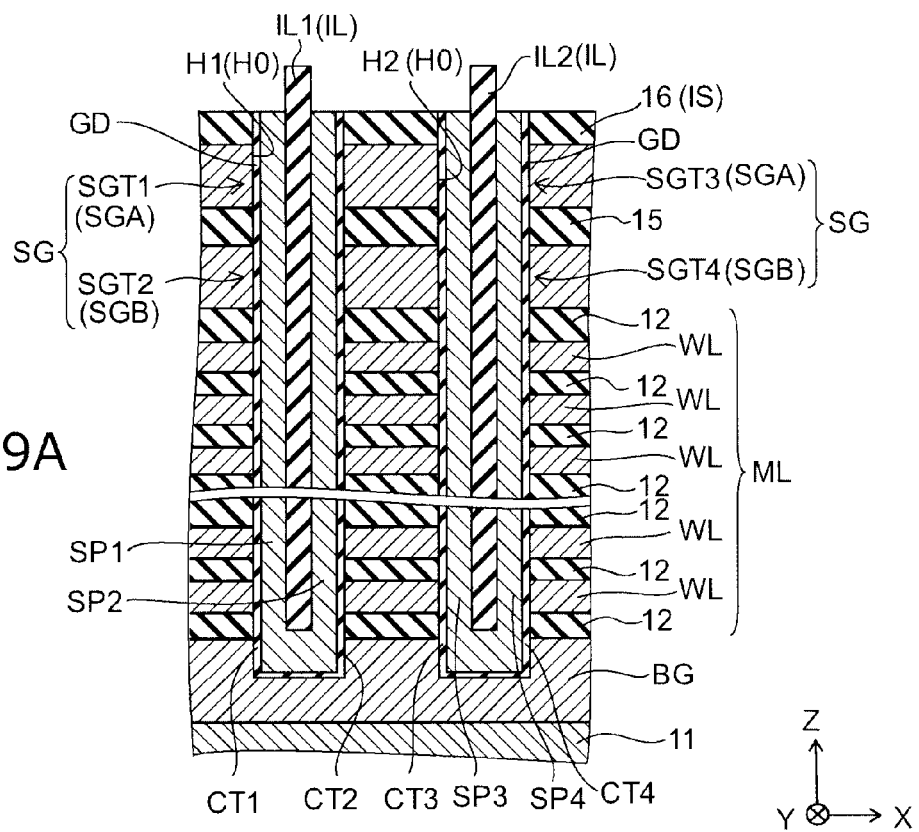
FIGS. 9A and 9B are schematic cross-sectional views illustrating a method for manufacturing the nonvolatile semiconductor memory according to the first embodiment of the invention continuing from FIG. 8D.
Figure 9B:
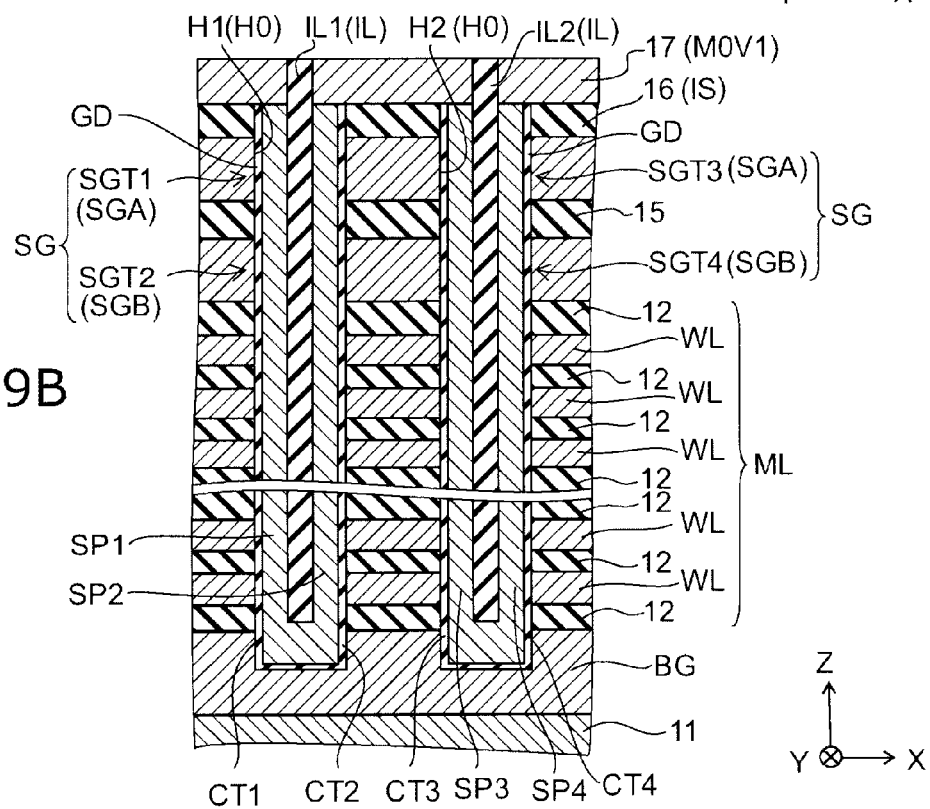

FIGS. 9A and 9B are schematic cross-sectional views continuing from FIG. 8D. Specifically, FIGS. 9A and 9B are schematic cross-sectional views corresponding to the cross section taken along line A-A' of FIG. 1A.

Figure 10A:
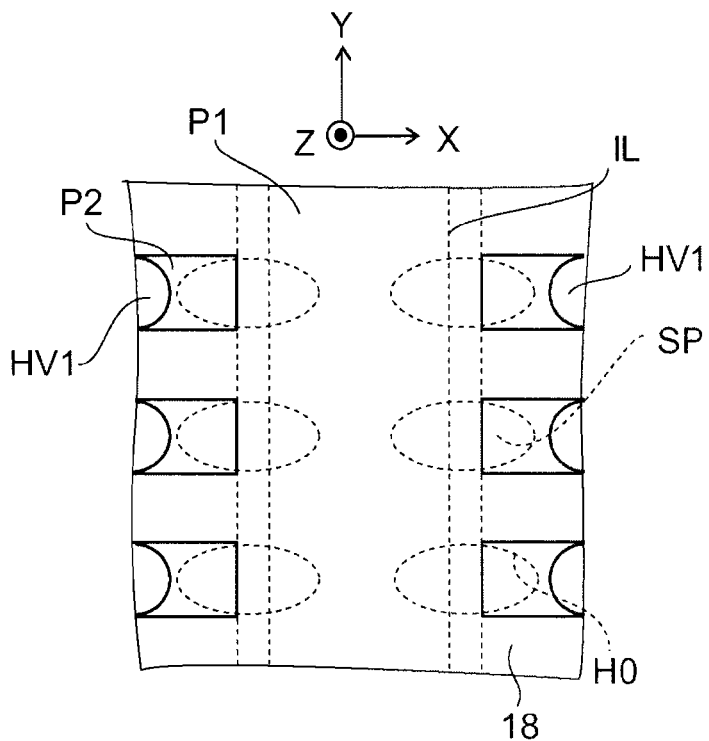
FIGS. 10A and 10B are schematic plan views illustrating a method for manufacturing the nonvolatile semiconductor memory according to the first embodiment of the invention continuing from FIG. 9B.
Figure 10B:
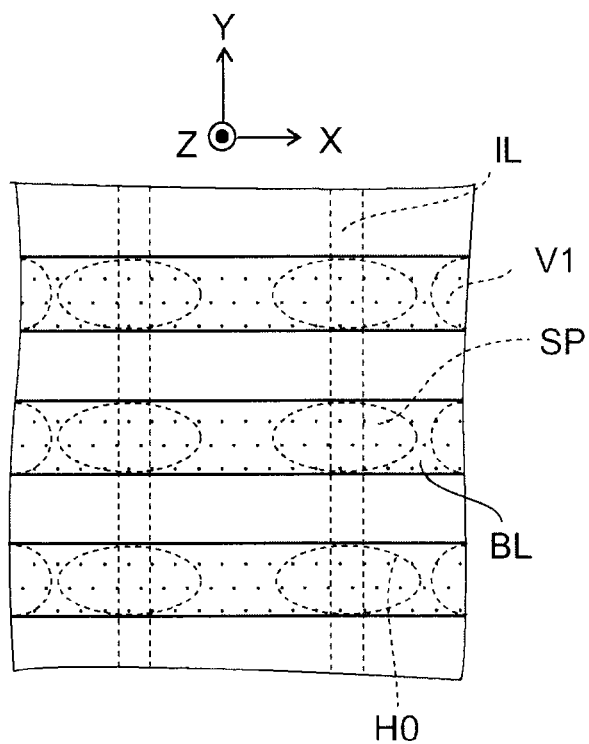

FIGS. 10A and 10B are schematic plan views continuing from FIG. 9B.

As illustrated in FIG. 7A, a silicon oxide film, for example, is formed on the semiconductor substrate 11, and a polysilicon film is formed thereon to form the back gate BG, in which the polysilicon film is used as the material of the gate. Then, a plurality of polysilicon layers that form the electrode films WL of the word lines and a plurality of silicon oxide films that form the insulating films 12 are alternately stacked thereon, and further a polysilicon layer that forms the lower-layer selection gate SGB of the selection gate SG, the insulating film 15 made of a silicon oxide film, a polysilicon layer that forms the upper-layer selection gate SGA, and the insulating film 16 (surface insulating film IS) made of a silicon oxide film are stacked. Then, lithography and RIE (reactive ion etching) are performed to form the through holes H0 having the cross-section of an oblate circle.

The diameter of the through holes H0 in the major axis direction XA (X direction) is 2 F, for example, the diameter of the through holes H0 in the minor axis direction (Y direction) is F, for example, and the spacing between the two through holes H0 is F in both the X direction and the Y direction.

At this time, as illustrated in FIG. 1B, the through holes H0 are formed to penetrate through the insulating film 16, the upper-layer selection gate SGA, the insulating film 15, the lower-layer selection gate SGB, and the stacked body ML in the Z direction at a depth of the partway in the back gate BG.

After that, as illustrated in FIG. 7B, the resist for the lithography is removed, then a film that forms the charge storage layer stacked body 24 and a material that forms the semiconductor pillar SP of the channel are deposited by CVD (chemical vapor deposition) so as to be buried in the through holes H0, and the film deposited on the surface of the insulating film 16 is removed by etch back. For the charge storage layer stacked body 24, stacked films of a silicon oxide film, a silicon nitride film that forms the charge storage layer, and a silicon oxide film, for example, may be used. Polysilicon, for example, is used for the semiconductor pillar SP.

After that, as illustrated in FIG. 7C, the through holes H0, and the semiconductor pillar SP and the charge storage layer stacked body 24 buried in the through holes H0 are divided by a slit HSL (trench) extending in the minor axis direction of the through holes H0. The slit HSL is configured to have a width of 0.5 F, for example. At this time, since the minimum feature size of the lithography is F, a spacer may be formed on the side surface of the hard mask material formed with a width of, for example, F to narrow the spacing between hard mask materials, and thereby the width of the portion exposed by the hard mask materials is made 0.5 F. Thus, the slit HSL with a width of 0.5 F can be formed.

RIE may be used for the formation of the slits HSL. At this time, as illustrated in FIG. 1B, the slit HSL is formed so that the semiconductor pillar SP may not be divided on a side of the semiconductor substrate 11 of the semiconductor pillar SP. Thereby, the first and second semiconductor pillars SP1 and SP2 are connected to each other in a U-shaped form (that is, the shape of the coupling of one end of the portion extending in one direction and one end of the portion extending in the opposite direction from the one direction). Similarly, the third and fourth semiconductor pillars SP3 and SP4 are connected to each other in a U-shaped form. Thus, in the through holes H0, the lowermost polysilicon of the semiconductor pillar SP is not removed by etching but left.

Thereby, the first and second semiconductor pillars SP1 and SP2, and the third and fourth semiconductor pillars SP3 and SP4 become a U-shaped NAND string, respectively.

After that, as illustrated in FIG. 7D, the hard mask materials are removed, and then a silicon nitride film, for example, is deposited as the hole-dividing-insulating-layer IL so as to be buried in the slit HSL. After that, the film deposited on the surface is removed by etch back.

At this time, a material having a high selection ratio for RIE to the insulating film 16 (surface insulating film IS) on the upper-layer selection gate SGA is used for the hole-dividing-insulating-layer IL. In other word, a material that has a sufficiently lower etching rate for RIE than the insulating film 16 is selected for the hole-dividing-insulating-layer IL. In this specific example, a silicon oxide film is used for the insulating film 16, and a silicon nitride film is used for the hole-dividing-insulating-layer IL. Thereby, as described later, the configuration in which the hole-dividing-insulating-layer IL protrudes upward from the surface of the insulating film 16 in a wall shape can be formed.

After that, as illustrated in FIG. 8A, a resist R1 is provided on one of the through holes H0 adjacent to each other in the X direction, for example, and ion implantation is performed into the semiconductor pillars SP corresponding to the portions of the upper-layer selection gate SGA and the lower-layer selection gate SGB while changing conditions, for example. Thereby, the first and second selection gate transistors SGT1 and SGT2 having thresholds different from each other are formed.

After removing the resist R1 mentioned above, as illustrated in FIG. 8B, a resist R2 is provided on the other of the through holes H0 adjacent to each other in the X direction, and ion implantation is performed into the semiconductor pillars SP corresponding to the portions of the upper-layer selection gate SGA and the lower-layer selection gate SGB while changing conditions, for example. Thereby, the third and fourth selection gate transistors SGT3 and SGT4 having thresholds different from each other are formed.

Thereby, as described in regard to FIG. 6, the first and fourth selection gate transistors SGT1 and SGT4 can be configured to be the depression type, for example, and the second and third selection gate transistors SGT2 and SGT3 can be configured to be the enhancement type, for example.

After that, as illustrated in FIG. 8C, lithography for the source line M0 is performed.

At this time, as illustrated in FIG. 8D, a pattern M0p of the source line M0 in the lithography includes: a pattern P1 extending in the Y direction in a spacing between the first hole-dividing-insulating-layer IL1 of the first through hole H1 and the second hole-dividing-insulating-layer IL2 of the second through hole H2; and a pattern P2 protruding from the pattern P1 in the X direction so as to cover the first through hole H1 and the second through hole H2. The pattern P1 forms later the source line M0, and the pattern P2 forms later the connecting section M0V1 of the same layer as the source line M0, which is connected to the contact via V1 described later.

Then, as illustrated in FIG. 9A, the hole-dividing-insulating-layer IL and the insulating film 16 which are not covered with the pattern of the source line M0 are etched by, for example, RIE. At this time, since the insulating film 16 has a higher etching rate than the hole-dividing-insulating-layer IL, the configuration in which the hole-dividing-insulating-layer IL protrudes upward from the surface of the insulating film 16 in a wall shape can be formed.

Then, as illustrated in FIG. 9B, after removing the resist for the photolithography, the metal film 17 that forms the source line M0 is deposited, and CMP (chemical mechanical polishing) processing is performed. Thereby, the source line M0 and the connecting section M0V1 are formed in a self-aligning manner with respect to the pattern of the hole-dividing-insulating-layer IL. That is, the source line M0 and the connecting section M0V1 are divided from each other by the hole-dividing-insulating-layer IL. Thus, the source line M0 and the connecting section M0V1 can be patterned by using the silicon nitride film remaining on the slit HSL, and the need of a high aligning accuracy can be eliminated in the lithography process.

Then, as illustrated in FIG. 10A, the interlayer insulating film is formed on the source line M0 and the connecting section M0V1, and then a hole for via HV1 is formed in the connecting section M0V1.

Then, as illustrated in FIG. 10B, a metal that forms the bit line BL is deposited thereon. At this time, the hole for via HV1 is filled with this metal to form the contact via V1. Then, this metal is patterned into strip shapes extending in the X direction by photolithography and etching to form the bit lines BL that bundle the contact via V1.

Thus, the nonvolatile semiconductor memory device 110 illustrated in FIGS. 1A and 1B, FIG. 2, FIG. 3, and FIG. 5 is fabricated. The nonvolatile semiconductor memory device 110 can provide a nonvolatile semiconductor memory device having a collective patterned three-dimensional stacked structure with an increased integration degree.

In this specific example, in the through hole H0, the first and second semiconductor pillars SP1 and SP2 provided inside to face each other in the major axis direction XA of the oblate circle are electrically connected to each other on a side of the semiconductor substrate 11, and the first and second semiconductor pillars SP1 and SP2 form a U-shaped NAND string. However, as described later, the embodiment of the invention is not limited thereto. The semiconductor pillar SP may have a rectilinear shape.

Figure 11:
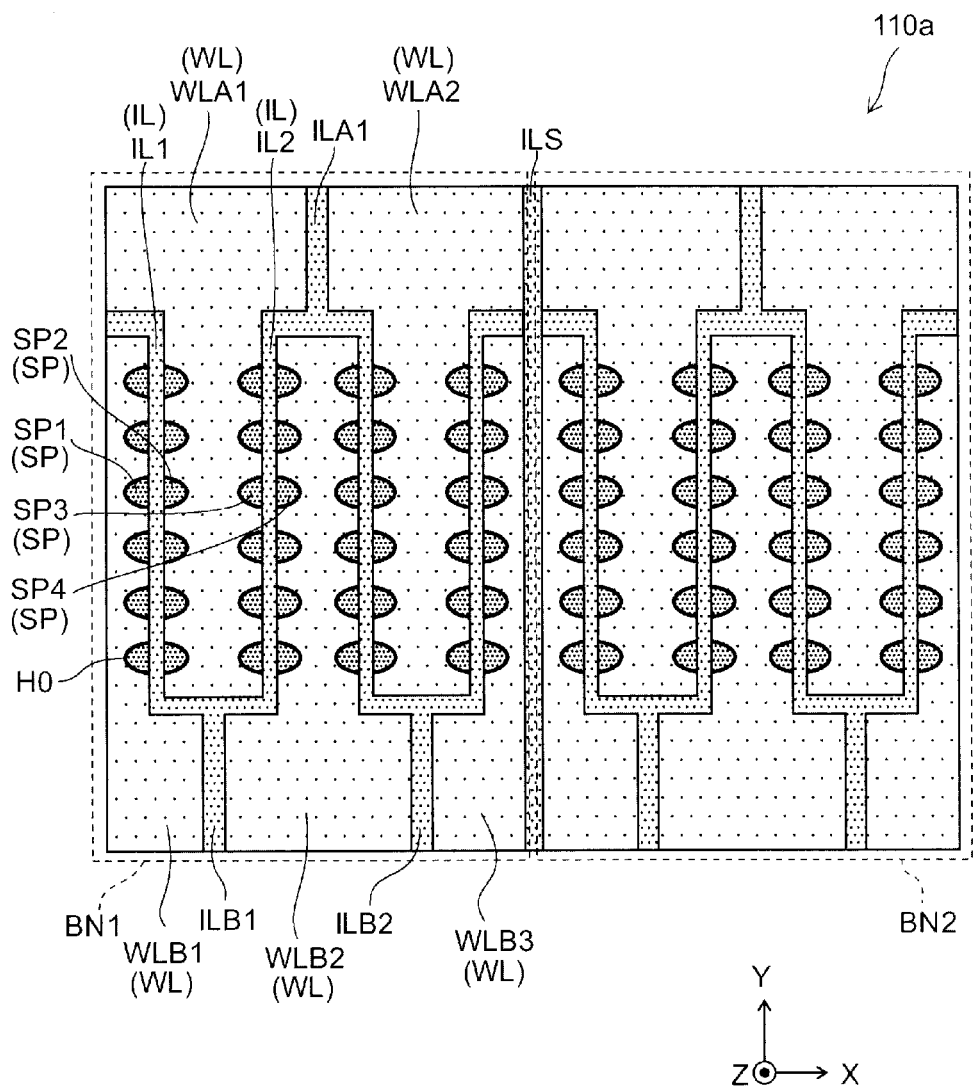
FIG. 11 is a schematic plan view illustrating the configuration of another nonvolatile semiconductor memory device according to the first embodiment of the invention.

FIG. 11 is a schematic plan view illustrating the configuration of another nonvolatile semiconductor memory device according to the first embodiment of the invention.

The drawing corresponds to FIG. 3 related to the nonvolatile semiconductor memory device 110.

As illustrated in FIG. 11, in another nonvolatile semiconductor memory device 110a according to this embodiment, the electrode film WL is divided in both of the erasing blocks BN1 and BN2. Specifically, although the electrode film WL in the nonvolatile semiconductor memory device 110 has the shape of an inter-digital electrode or a multi-finger electrode, in this specific example, an insulating layer ILA1 is provided between electrode films WLA1 and WLA2, and insulating layers ILB1 and ILB2 are provided between electrode films WLB1 and WLB2, and between electrode films WLB2 and WLB3, respectively.

Although not illustrated in FIG. 11, the length in the Y direction of the electrode film WL (electrode films WLA1, WLA2, WLB1, WLB2, and WLB3) stacked in the Z direction changes in a staircase-like manner at both ends in the Y direction. Electrical connection with the peripheral circuit is performed at one end in the Y direction by the electrode films WLA1 and WLA2. Electrical connection with the peripheral circuit is performed at the other end in the Y direction by the electrode films WLB1, WLB2, and WLB3.

Thereby, different electric potentials can be set between the first semiconductor pillar SP1 and the second semiconductor pillar SP2. Furthermore, different electric potentials can be set between the third semiconductor pillar SP3 and the fourth semiconductor pillar SP4.

That is, the electrode film WL is divided in a plane perpendicular to the stacking direction of the stacked body ML; a portion of the electrode film WL facing the first semiconductor pillar SP1 (for example, the electrode film WLB1) can be set at a first electric potential; a portion of the electrode film WL facing the second semiconductor pillar SP2 (for example, the electrode film WLA1) and a portion of the electrode film WL facing the third semiconductor pillar SP3 (for example, the electrode film WLA1) can be set at a second electric potential different from the first electric potential; and a portion of the electrode film WL facing the fourth semiconductor pillar SP4 (for example, the electrode film WLB2) can be set at a third electric potential different from both the first electric potential and the second electric potential.

The nonvolatile semiconductor memory device 110a having such a configuration also can provide a nonvolatile semiconductor memory device having a collective patterned three-dimensional stacked structure with an increased integration degree.

The configuration of connection can be simplified by using the shape of an inter-digital electrode or a multi-finger electrode for the electrode film WL similar to the nonvolatile semiconductor memory device 110.

Second Embodiment

Figure 12A:
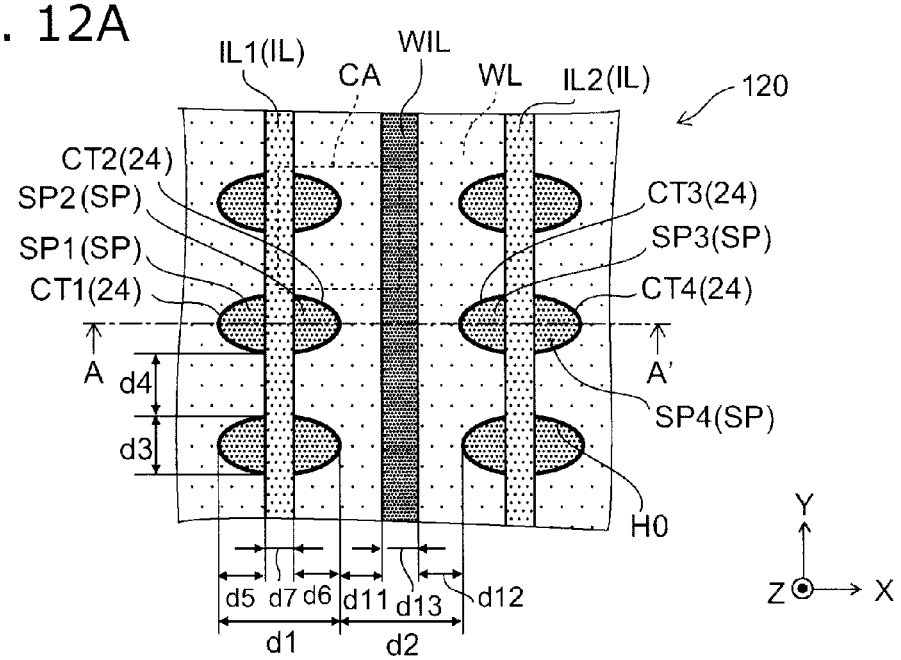
FIGS. 12A and 12B are schematic views illustrating the configuration of a nonvolatile semiconductor memory device according to a second embodiment of the invention.
Figure 12B:
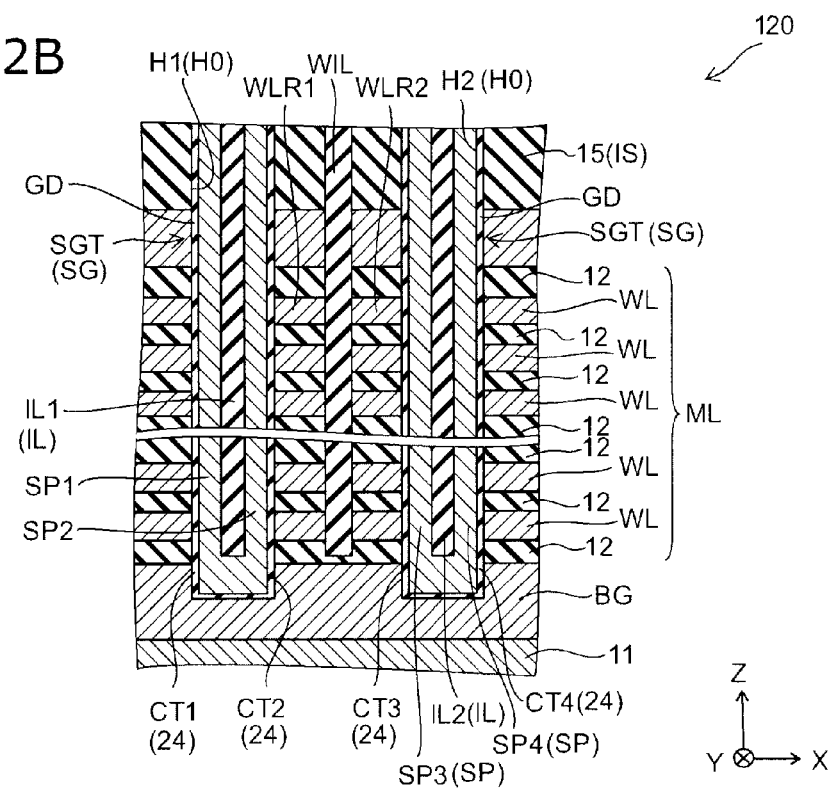

FIGS. 12A and 12B are schematic views illustrating the configuration of a nonvolatile semiconductor memory device according to a second embodiment of the invention.

Specifically, FIG. 12A is a plan view and FIG. 12B is a cross-sectional view taken along line A-A' of FIG. 12A.

As illustrated in FIGS. 12A and 12B, the portion of the through hole H0 in a nonvolatile semiconductor memory device 120 according to the second embodiment of the invention is similar to the nonvolatile semiconductor memory device 110. That is, the through hole H0 (first through hole H1) having the cross section of an oblate circle is provided in the stacked body ML having the plurality of electrode films WL and the plurality of insulating films 12 being alternately stacked on the semiconductor substrate 11. The first semiconductor pillar SP1 and the second semiconductor pillar SP2 are provided inside the through hole H0 to face each other in the major axis direction XA of the oblate circle. The first and second charge storage layers CT1 and CT2 are provided between the electrode film WL, and the first and second semiconductor pillars SP1 and SP2, respectively. The hole-dividing-insulating-layer IL (first hole-dividing-insulating-layer IL1) is provided between the first and second semiconductor pillars SP1 and SP2.

In the nonvolatile semiconductor memory device 120, the electrode film WL is divided between the first through hole H1 and the second through hole H2.

The nonvolatile semiconductor memory device 120 further includes: the third semiconductor pillar SP3 and the fourth semiconductor pillar SP4 provided inside the second through hole H2 adjacent to the first through hole H1 in the major axis direction XA, the second through hole H2 penetrating through the stacked body ML in the stacking direction (Z direction) of the stacked body ML, the second through hole H2 having the second cross section of a second oblate circle having the second major axis direction in a direction parallel to the first major axis direction XA, the second cross section being cut in a direction perpendicular to the stacking direction, the third semiconductor pillar SP3 facing the fourth semiconductor pillar SP4 in the second major axis direction of the second through hole H2, the third semiconductor pillar SP3 and the fourth semiconductor pillar SP4 extending in the stacking direction; the third charge storage layer CT3 provided between the electrode film WL and the third semiconductor pillar SP3; and the fourth charge storage layer CT4 provided between the electrode film WL and the fourth semiconductor pillar SP4.

The nonvolatile semiconductor memory device 120 further includes an inter-hole-dividing-insulating-film WIL that divides the electrode film WL into a region (first electrode film region WLR1) facing the first through hole H1 and a region (second electrode film region WLR2) facing the second through hole H2 between the first through hole H1 and the second through hole H2.

Thereby, the electrode film WL is divided along the X direction, that is, the first electrode film region WLR1 and the second electrode film region WLR2 extend in the Y direction.

A silicon oxide film, for example, is used for the inter-hole-dividing-insulating-film WIL. However, a silicon nitride film may be used for the inter-hole-dividing-insulating-film WIL, and any insulative material may be used.

Similar to the nonvolatile semiconductor memory device 110, the first hole-dividing-insulating-layer IL1 is provided between the first and second semiconductor pillars SP1 and SP2, and the second hole-dividing-insulating-layer IL2 is provided between the third and fourth semiconductor pillars SP3 and SP4.

The first and second semiconductor pillars SP1 and SP2 are electrically connected to each other on a side of the semiconductor substrate 11, and the third and fourth semiconductor pillars SP3 and SP4 are electrically connected to each other on a side of the semiconductor substrate 11. A semiconductor material such as polysilicon and amorphous silicon, which forms the first to fourth semiconductor pillars SP1 to SP4, is used for these connections.

Also in this specific example, the numbers of stacked insulating films 12 and electrode films WL in the stacked body ML are arbitrarily.

At this time, as illustrated in FIG. 12A, in the X direction, the diameter of the first through hole H1 is denoted by "d1", the thickness of the first hole-dividing-insulating-layer IL1 is denoted by "d7", the distance from one end of the first through hole H1 to the first hole-dividing-insulating-layer IL1 is denoted by "d5", and the distance from the other end to the first hole-dividing-insulating-layer IL1 is denoted by "d6". In this specific example, d5=d6. The diameter of the first through hole H1 in the Y direction is denoted by "d3". It is assumed that the through holes other than the first through hole H1 also have the same shape.

In the X direction, the distance between the first through hole H1 and the second through hole H2 is denoted by "d2". The width of the inter-hole-dividing-insulating-film WIL is denoted by "d13". The distance between the first through hole H1 and the inter-hole-dividing-insulating-film WIL is denoted by "d11", and the distance between the second through hole H2 and the inter-hole-dividing-insulating-film WIL is denoted by "d12". In this specific example, d11=d12. That is, d2=d11+d13+d12.

The distance between through holes H0 in the Y direction is denoted by "d4".

Here, when the minimum feature size in the manufacture of the nonvolatile semiconductor memory device 110 is denoted by "F", d3 and d4 can be set to F. In the case where a width of 0.5 F is obtained as the finish width by using a method such as slimming, d7 can be made 0.5 F. When d1 is assumed to be 2 F, d5 and d6 become 0.75 F.

On the other hand, d13 also can be made 0.5 F. When d2 is assumed to be 2 F, d11 and d12 become 0.75 F.

In other words, the length (being d13; for example, 0.5 F) of the hole-dividing-insulating-film WIL along the major axis direction XA can be set to substantially 0.5 times the length (being d3; for example, F) of the first through hole H1 along the minor axis direction.

Each set value mentioned above is set so as to obtain an appropriate shape in view of the aligning accuracy of lithography similar to the first embodiment.

The occupation area CA of one memory cell in the XY plane in one layer of the stacked body ML of this case is (d1+d2)×(d3+d4)/2, and in this case the occupation area CA becomes 4 F×2 F/2=4 $F^2$.

Thus, also in the nonvolatile semiconductor memory device 120, the occupation area CA of a memory cell is smaller than 6 $F^2$ and 4.5 $F^2$ of the nonvolatile semiconductor memory devices 119a and 119b of the first and second comparative examples.

Thus, in the nonvolatile semiconductor memory device 120, although the occupation area CA of a memory cell is larger than 3 $F^2$ of the nonvolatile semiconductor memory device 110, a high density of 4 $F^2$ can be achieved.

In the nonvolatile semiconductor memory device 120, the diameter (d1) of the through hole H0 in the major axis direction is preferably not less than 1.5 times and less than 3.5 times the diameter (d3) in the minor axis direction, for example.

Specifically, in the case where the diameter (d1) in the major axis direction is smaller than 1.5 times the diameter (d3) in the minor axis direction, for example, when d3 is assumed to be F and d7 is assumed to be 0.5 F, d5 and d6 become smaller than 0.5 F, the resistance value of the semiconductor pillar SP increases, the area of the charge storage layer of the charge storage layer stacked body 24 decreases, and the processing becomes difficult.

In the case where the diameter (d1) in the major axis direction is not less than 3.5 times the diameter (d3) in the minor axis direction, the first through hole H1 and the second through hole H2 adjacent to each other along the X direction overlap each other undesirably if maintaining a desired occupation area CA of a memory cell is attempted.

The nonvolatile semiconductor memory device 120 has an advantage over the nonvolatile semiconductor memory device 110 in that only one layer of selection gate SG is sufficient. The selection gate SG in the nonvolatile semiconductor memory device 120 will now be described.

Figure 13:
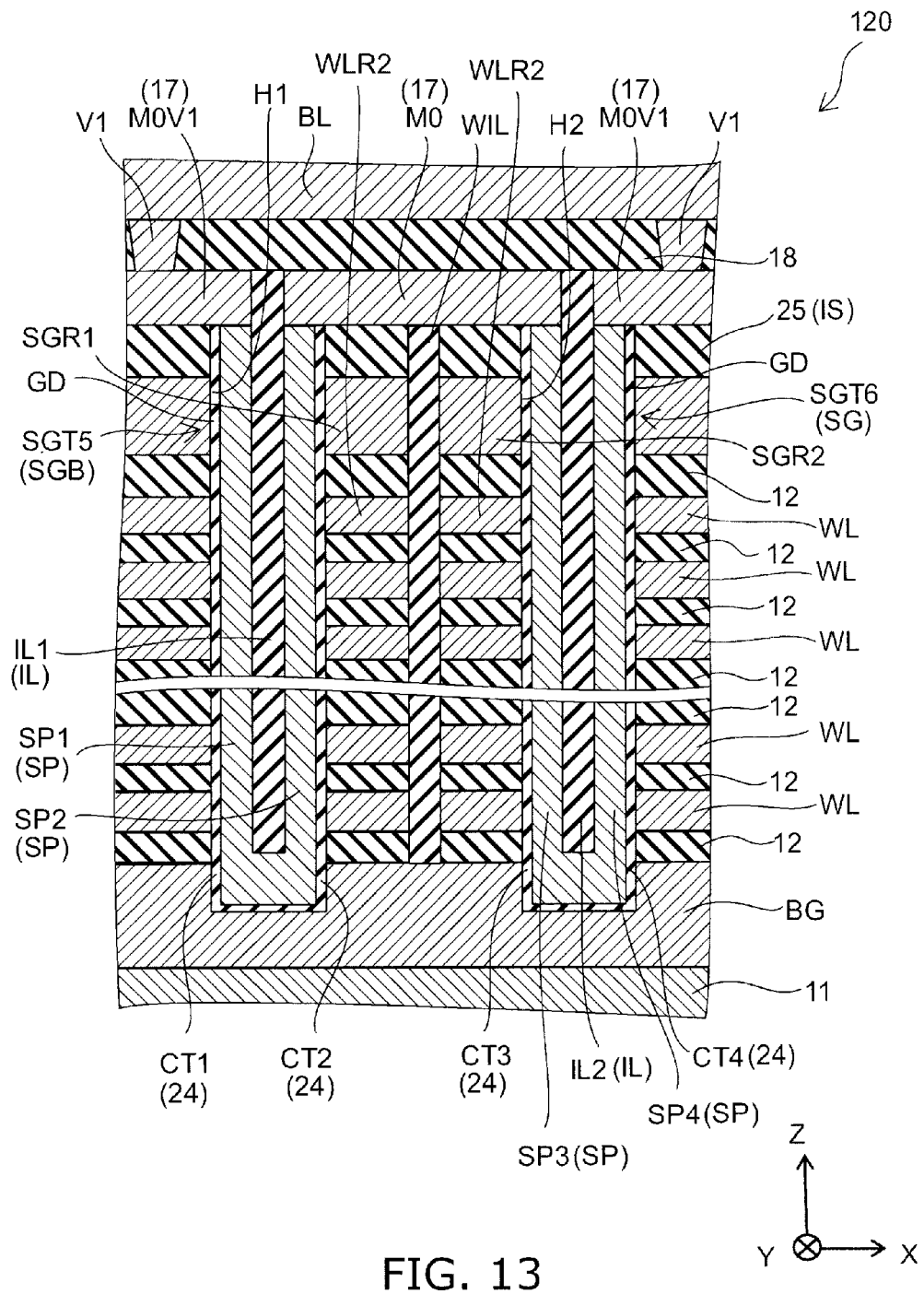
FIG. 13 is a schematic cross-sectional view illustrating the configuration of the nonvolatile semiconductor memory device according to the second embodiment of the invention.

FIG. 13 is a schematic cross-sectional view illustrating the configuration of the nonvolatile semiconductor memory device according to the second embodiment of the invention.

The drawing is a cross-sectional view corresponding to the cross section taken along line A-A' of FIG. 12A.

As illustrated in FIG. 13, in the nonvolatile semiconductor memory device 120, one layer of selection gate SG is provided on the stacked body ML. That is, whereas two layers of selection gates of the upper-layer selection gate SGA and the lower-layer selection gate SGB are provided for one through hole H0 in the case of the nonvolatile semiconductor memory device 110, one selection gate SG is provided for one through hole H0 in the nonvolatile semiconductor memory device 120 according to this embodiment.

The gate insulating films GD are provided between the selection gate SG, and the first and second semiconductor pillars SP1 and SP2, and between the selection gate SG, and the third and fourth semiconductor pillars SP3 and SP4. The portions where the selection gate SG and these semiconductor pillars intersect function as the selection gate transistors SGT.

An insulating film 25 (surface insulating film IS) is provided on the selection gate SG, and the metal film 17 that forms the source line M0 is provided thereon. The source line M0 is connected to the second and third semiconductor pillars SP2 and SP3 proximal to each other. In this specific example, the source line M0 is provided to extend in the Y direction. Further, the metal film 17 forms the connecting section M0V1 to the contact via V1.

The insulating film 18 is provided on the metal film 17, the contact via V1 is provided in the insulating film 18, and the bit line BL is provided thereon so as to extend in the X direction.

The first semiconductor pillar SP1 on a side of the first through hole H1 opposite to the second through hole H2 is connected to the bit line BL via the connecting section M0V1 and the contact via V1. Similarly, the fourth semiconductor pillar SP4 on a side of the second through hole H2 opposite to the first through hole H1 is connected to the bit line BL via the connecting section M0V1 and the contact via V1.

The inter-hole-dividing-insulating-film WIL divides the selection gate SG into a region (first selection gate region SGR1) facing the first through hole H1 and a region (second selection gate region SGR2) facing the second through hole H2 between the first through hole H1 and the second through hole H2 adjacent to each other. Thereby, the selection gate SG is divided along the X direction, that is, the first and second selection gate regions SGR1 and SGR2 extend in the Y direction.

In the nonvolatile semiconductor memory device 120, the electrode film WL is divided into the first and second electrode film regions WLR1 and WLR2 by the inter-hole-dividing insulating-film WIL between the first through hole H1 and the second through hole H2 adjacent to each other. The selection gate SG is divided into the first and second selection gate regions SGR1 and SGR2 between the first through hole H1 and the second through hole H2 adjacent to each other. Thereby, even in the configuration in which one layer of selection gate SG is provided, a memory cell of the first through hole H1 and a memory cell of the second through hole H2 can be distinctly selected.

Thus, the nonvolatile semiconductor memory device 120 further includes: a fifth selection gate transistor SGT5 provided at the end portion on a side of the first and second semiconductor pillars SP1 and SP2 opposite to the semiconductor substrate 11; and a sixth selection gate transistor SGT6 provided at the end portion on a side of the third and fourth semiconductor pillars SP3 and SP4 opposite to the semiconductor substrate 11.

The inter-hole-dividing-insulating-film WIL divides the selection gates SG of the fifth and sixth gate transistors SGT5 and SGT6 from each other.

That is, in the nonvolatile semiconductor memory device 120, two NAND strings that are connected to the same bit line BL and adjacent to each other (a U-shaped NAND string including the first and second semiconductor pillars SP1 and SP2, and a U-shaped NAND string including the third and fourth semiconductor pillars SP3 and SP4) are connected to the selection gates SG different from each other (the fifth selection gate transistor SGT5 and the sixth selection gate transistor SGT6). Thereby, the required number of selection gate can be one for each of both ends of the NAND string.

Thereby, the manufacturing process is easier for the nonvolatile semiconductor memory device 120 than for the nonvolatile semiconductor memory device 110.

Also in the nonvolatile semiconductor memory device 120 according to this embodiment, the electrode film WL may have the shape of an inter-digital electrode or a multi-finger electrode illustrated in FIG. 3, or the shape of being divided with respect to the X direction as illustrated in FIG. 11.

An example of the method for manufacturing the nonvolatile semiconductor memory device 120 will now be described.

FIGS. 14A to 14D are schematic sequential plan views illustrating a method for manufacturing the nonvolatile semiconductor memory device according to the second embodiment of the invention.

Figure 14A:
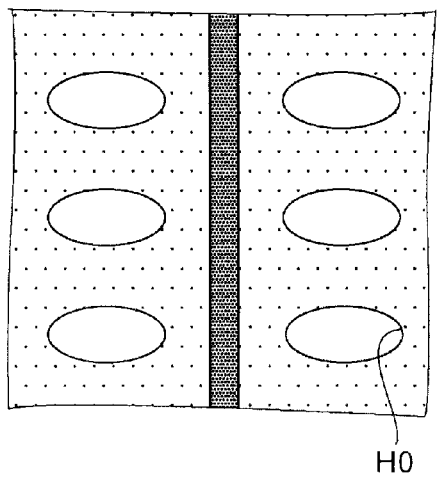
FIGS. 14A to 14D are schematic sequential process plan views illustrating a method for manufacturing the nonvolatile semiconductor memory device according to the second embodiment of the invention.
Figure 14B:
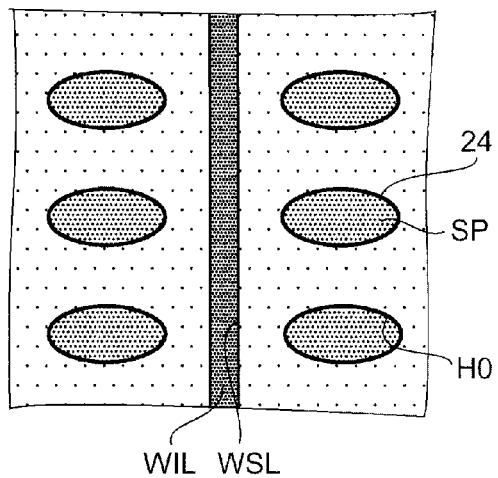
Figure 14C:
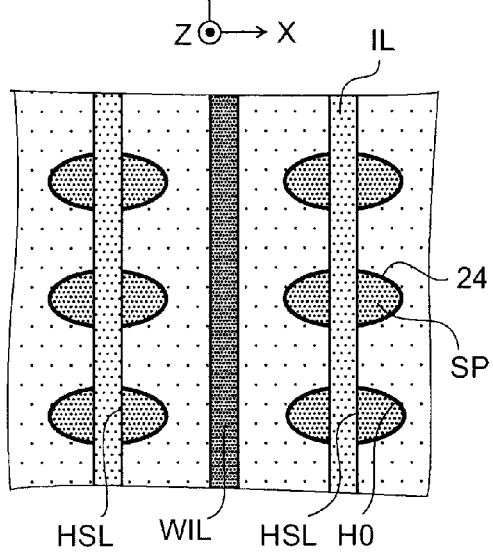
Figure 14D:
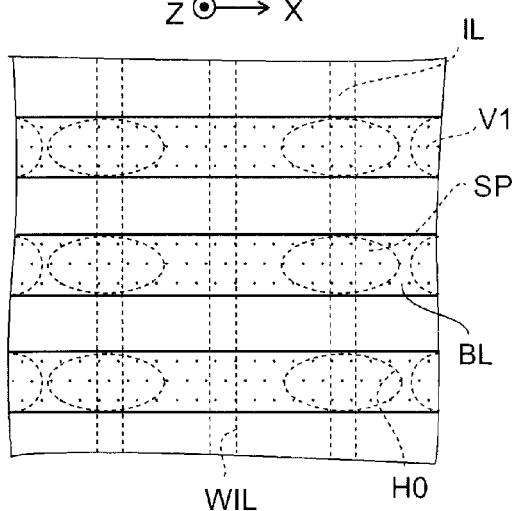

Specifically, FIG. 14A is a view of the first process, and FIGS. 14B to 14D are views continuing from the respective previous processes.

As illustrated in FIG. 14A, similar to the first embodiment, the plurality of electrode films WL (polysilicon) and the plurality of insulating films 12 (silicon oxide films) are alternately stacked on the back gate BG on the semiconductor substrate 11, and further a polysilicon layer that forms the selection gate SG and the insulating film 25 made of a silicon oxide film are stacked. Then, lithography and RIE are performed to form the through holes H0 with the cross section of an oblate circle.

The diameter of the through hole H0 in the major axis direction XA (X direction) is 2 F, for example, and the diameter of the through hole H0 in the minor axis direction (Y direction) is F, for example. The spacing between through holes H0 in the major axis direction XA is 2 F, for example, and the spacing between through holes H0 in the minor axis direction is F, for example.

After that, as illustrated in FIG. 14B, a film that forms the charge storage layer stacked body 24 and a material that forms the semiconductor pillar SP of the channel are deposited by CVD so as to be buried in the through holes H0. Then, an inter-hole slit WSL extending in the Y direction is formed between the first through hole H1 and the second through hole H2, and then a silicon oxide film, for example, is buried in the inter-hole slit WSL to form the inter-hole-dividing-insulating-film WIL.

At this time, as described above, by forming a spacer on the side wall of the resist for the photolithography, the width of the slit is made 0.5 F, for example. Thereby, the width of the inter-hole-dividing-insulating-film WIL becomes 0.5 F.

After that, as illustrated in FIG. 14C, similar to the first embodiment, the through holes H0, and the semiconductor pillars SP and the charge storage layer stacked body 24 buried in the through holes H0 are divided by the slit HSL (trench) extending in the minor axis direction of the through holes H0. The slit HSL is configured to have a width of 0.5 F, for example.

After that, a silicon nitride film, for example, is film-formed so as to be buried in the slit HSL to form the hole-dividing-insulating-layer IL.

At this time, similar to the first embodiment, a material having a sufficiently lower etching rate for RIE than the insulating film 25 (surface insulating film IS) may be selected as the material for the hole-dividing-insulating-layer IL. Thereby, the configuration in which the hole-dividing-insulating-layer IL protrudes upward from the surface of the insulating film 25 in a wall shape can be formed. In this case, a silicon oxide film is used for the insulating film 25, and a silicon nitride film is used for the hole-dividing-insulating-layer IL.

After that, ion implantation is performed into the semiconductor pillar SP that forms the channel of the selection gate SG, for example. In this embodiment, since one layer of selection gate SG is provided unlike the first embodiment, the ion implantation is performed uniformly on the entire surface. Thereby, the fifth and sixth selection gate transistors SGT5 and SGT6 are formed. This ion implantation may be performed as necessary and can be omitted.

After that, as illustrated in FIG. 14D, similar to the first embodiment, lithography for the source line M0 is performed, and the hole-dividing-insulating-layer IL and the insulating film 25 which are not covered with the pattern of the source lines M0 are etched by RIE, for example, to form the configuration in which the hole-dividing-insulating-layer IL protrudes upward from the surface of the insulating film 25 in a wall shape.

Then, the metal film 17 that forms the source line M0 is deposited and CMP processing is performed. Thereby, the source line M0 and the connecting section M0V1 are formed in a self-aligning manner with respect to the pattern of the hole-dividing-insulating-layer IL.

Then, the insulating film 18 is formed on the source line M0 and the connecting section M0V1. Then, the hole for via HV1 is formed in the insulating film 18 and a metal that forms the bit lines BL is deposited thereon. Lithography and etching are performed to form the contact via V1 and the bit lines BL.

Thus, the nonvolatile semiconductor memory device 120 illustrated in FIGS. 12A, 12B and FIG. 13 is fabricated. The nonvolatile semiconductor memory device 120 can provide a nonvolatile semiconductor memory device having a collective patterned three-dimensional stacked structure with an increased integration degree.

Also in this specific example, the first and second semiconductor pillars SP1 and SP2 are electrically connected to each other on a side of the semiconductor substrate 11 to form a U-shaped NAND string, but the embodiment of the invention is not limited thereto.

In other words, the first and second semiconductor pillars SP1 and SP2 may not be electrically connected to each other on a side of the semiconductor substrate 11 but may each form an independent rectilinear NAND string. In the case where each of the first and second semiconductor pillars SP1 and SP2 has an independent rectilinear shape, a lower selection gate may be provided between the stacked body ML and the semiconductor substrate 11.

Third Embodiment

Figure 15:
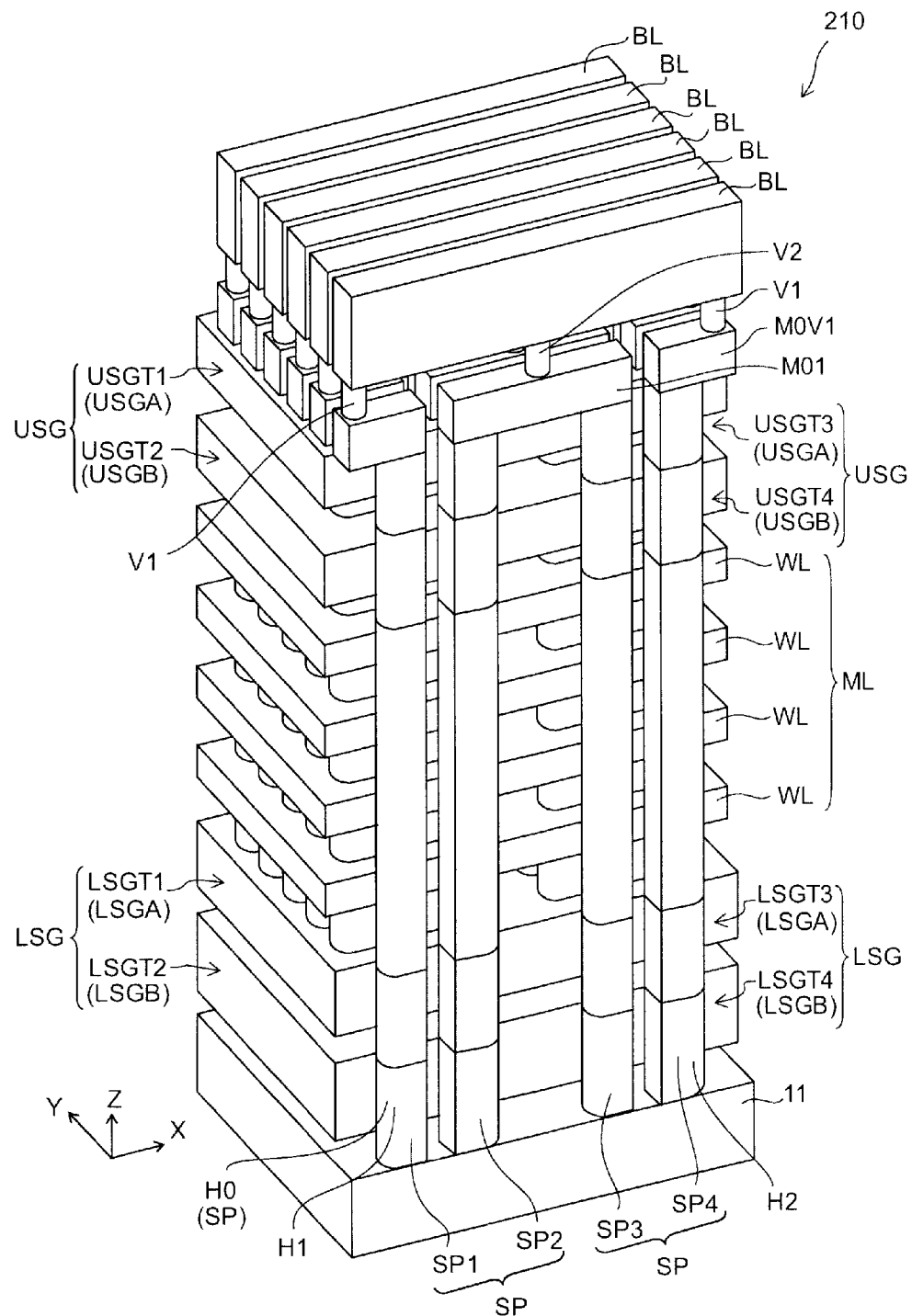
FIG. 15 is a schematic perspective view illustrating the configuration of a nonvolatile semiconductor memory device according to a third embodiment of the invention.

FIG. 15 is a schematic perspective view illustrating the configuration of a nonvolatile semiconductor memory device according to a third embodiment of the invention.

As illustrated in FIG. 15, in a nonvolatile semiconductor memory device 210 according to the third embodiment of the invention, the semiconductor pillars SP are not connected in the U-shaped form, but rectilinear NAND strings are formed. Other than this, the configuration may be similar to the nonvolatile semiconductor memory device 110. Furthermore, this configuration can be used for all nonvolatile semiconductor memory devices according to the embodiments of the invention described above.

In the nonvolatile semiconductor memory device 210, the first and second semiconductor pillars SP1 and SP2 are not electrically connected to each other on a side of the semiconductor substrate 11, but are each an independent rectilinear NAND string. Further, a source line is provided in the semiconductor substrate 11. The first semiconductor pillar SP1 is connected to the bit line BL via the connecting section M0V1 and the contact via V1, and the second semiconductor pillar SP2 and the third semiconductor pillar SP3 adjacent thereto are connected to the bit line via a connecting section M01 and another contact via V2. The fourth semiconductor pillar SP4 is connected to the bit line via the connecting section M0V1 and the contact via V1.

Selection gates are provided on both a side (lower side) of the semiconductor substrate 11 of the stacked body ML and a side (upper side) of the stacked body ML opposite to the semiconductor substrate 11, for example.

In other words, a lower selection gate LSG is provided between the stacked body ML and the semiconductor substrate 11, and an upper selection gate USG is provided on the upper side of the stacked body ML. In this specific example, the lower selection gate LSG includes a lower upper-layer selection gate LSGA and a lower lower-layer selection gate LSGB. The upper selection gate USG includes an upper upper-layer selection gate USGA and an upper lower-layer selection gate USGB.

The lower upper-layer selection gate LSGA and the lower lower-layer selection gate LSGB have thresholds different from each other.

Similarly, the upper upper-layer selection gate USGA and the upper lower-layer selection gate USGB have thresholds different from each other.

For example, the lower upper-layer selection gate LSGA corresponding to the first and second semiconductor pillars SP1 and SP2 corresponds to a selection gate transistor LSGT1, and the lower lower-layer selection gate LSGB corresponds to a selection gate transistor LSGT2. Furthermore, the lower upper-layer selection gate LSGA corresponding to the third and fourth semiconductor pillars SP3 and SP4 corresponds to a selection gate transistor LSGT3, and the lower lower-layer selection gate LSGB corresponds to a selection gate transistor LSGT4.

The selection gate transistor LSGT1 is configured to be the enhancement type, and the selection gate transistor LSGT2 is configured to be the depression type. On the other hand, the selection gate transistor LSGT3 is configured to be the depression type, and the selection gate transistor LSGT4 is configured to be the enhancement type.

Similarly, the upper upper-layer selection gate USGA corresponding to the first and second semiconductor pillars SP1 and SP2 corresponds to a selection gate transistor USGT1, and the upper lower-layer selection gate USGB corresponds to a selection gate transistor USGT2. Furthermore, the upper upper-layer selection gate USGA corresponding to the third and fourth semiconductor pillars SP3 and SP4 corresponds to a selection gate transistor USGT3, and the upper lower-layer selection gate USGB corresponds to a selection gate transistor USGT4.

The selection gate transistor USGT1 is configured to be the depression type, and the selection gate transistor USGT2 is configured to be the enhancement type. On the other hand, the selection gate transistor USGT3 is configured to be the enhancement type, and the selection gate transistor USGT4 is configured to be the depression type.

Thereby, the first to fourth semiconductor pillars SP1 to SP4 can be distinctly selected.

Although the case where two layers of lower selection gates LSG are provided is described in the above, the configuration in which one layer of lower selection gate LSG is provided is also possible. However, if two layers of lower selection gates LSG having thresholds different from each other are provided similar to the upper selection gates USG, the selectivity of memory cell improves, and stable operation is achieved.

Furthermore, also in the configuration of the nonvolatile semiconductor memory device 120, the semiconductor pillars SP may form rectilinear NAND strings. In this case also, selection gates are provided on both the upper side and the lower side of the stacked body ML.

In the case where the first and second semiconductor pillars SP1 and SP2 are connected to each other on a side of the semiconductor substrate 11 to form a U-shaped NAND string similar to the nonvolatile semiconductor memory devices 110 and 120, a variation in electrical characteristics due to the position from the power supply end of the semiconductor pillar is suppressed, the problem of complicated interconnect installation for the NAND string is avoided, and the density increase is further promoted, compared to the case of two rectilinear NAND strings. Thus, this configuration is more preferable.

Fourth Embodiment

Figure 16:
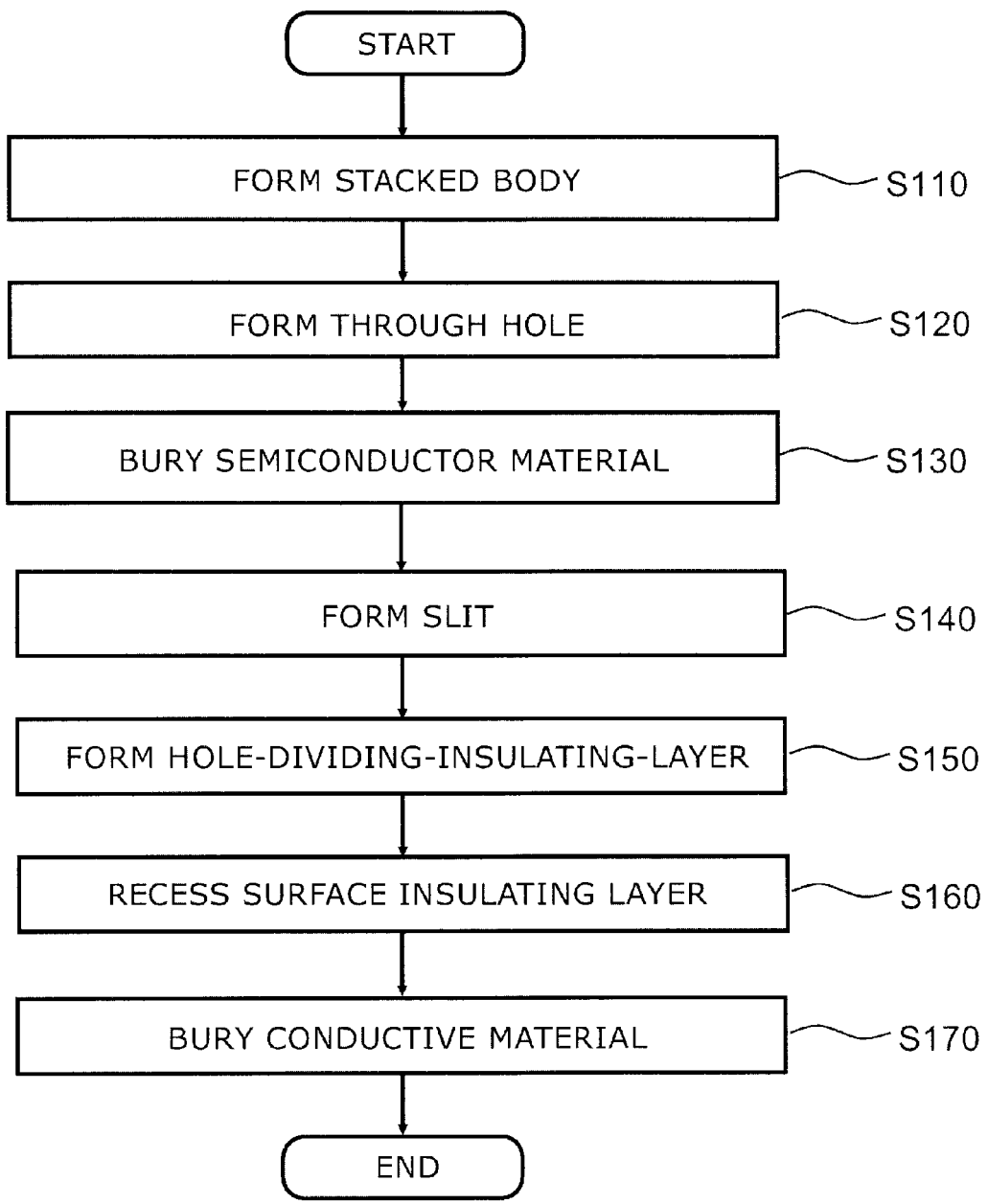
FIG. 16 is a flow chart illustrating a method for manufacturing a nonvolatile semiconductor memory device according to a fourth embodiment of the invention.

A fourth embodiment of the invention relates to a method for manufacturing a nonvolatile semiconductor memory device. FIG. 16 is a flow chart illustrating the method for manufacturing a nonvolatile semiconductor memory device according to the fourth embodiment of the invention.

As illustrated in FIG. 16, in the manufacturing method according to this embodiment, first, the plurality of insulating films 12 and the plurality of electrode films WL are alternately stacked on a substrate (for example, the semiconductor substrate 11) to form the stacked body ML (step S110).

Then, the through holes H0 (for example, the first and second through holes H1 and H2) that penetrate through the stacked body ML in the stacking direction (Z direction) of the stacked body ML and have the cross section of an oblate circle when cutting with a plane perpendicular to the stacking direction are formed (step S120).

In step S110 and step S120, the methods described in regard to FIG. 7A and FIG. 14A, for example, may be employed.

For example, the diameters of the through holes H0 in the major axis direction XA and the minor axis direction may be, for example, 2 F and F, respectively. The spacing between through holes H0 adjacent to each other in the minor axis direction may be F, for example.

The spacing between the through holes H0 adjacent to each other in the major axis direction XA may be F, 2 F, or the like, for example.

Then, a layer including the charge storage layer (for example, the charge storage layer stacked body 24) is formed on the inner wall of the through hole H0, and then a semiconductor material is buried in the remaining space of the through hole H0 (step S130). This semiconductor material is a semiconductor material that forms the semiconductor pillars SP (that is, the first to fourth semiconductor pillars SP1 to SP4). The methods described in regard to FIG. 7B and FIG. 14B, for example, may be employed for this.

Then, the slit HSL (for example, a first and a second slit HSL1 and HSL2) is formed to divide the layer including the charge storage layer and the semiconductor material with a plane (e.g. the Y-Z plane) including the direction (e.g. the Y direction) perpendicular to the major axis direction of the oblate circle of the through holes H0 and the stacking direction (e.g. the Z direction) of the stacked body ML (step S140). The methods described in regard to FIG. 7C and FIG. 14C, for example, may be employed for this.

Then, an insulating material is buried in the slit HSL to form the hole-dividing-insulating-layer IL (for example, the first and second hole-dividing-insulating-layers IL1 and IL2) (step S150). The insulating material has an etching rate lower than the etching rate of the surface insulating film IS (for example, the insulating film 16 illustrated in FIG. 5, or the insulating film 25 illustrated in FIG. 13), which is disposed on the surface of the stacked body ML. Specifically, as described above, a silicon oxide film is used for the surface insulating film IS, and a silicon nitride film is used for the hole-dividing-insulating-layer IL. The methods described in regard to FIG. 7D and FIG. 14C, for example, may be employed for this.

Then, the surface insulating film IS is etched so that the surface of the surface insulating film IS recesses from the upper surface of the hole-dividing-insulating-layer IL (step S160). The methods described in regard to FIG. 8C to FIG. 9A and FIG. 14D, for example, may be employed for this.

Then, a conductive material is buried in the space formed by the recessing of the surface of the surface insulating film IS (step S170). In other words, the conductive material is buried between each of the hole-dividing-insulating-layers IL protruding upward from the surface insulating film IS. This conductive material forms the source lines M0 and the connecting section M0V1 for the contact via V1. The methods described in regard to FIG. 9B and FIG. 14D, for example, may be employed for this.

Thereby, the nonvolatile semiconductor memory devices 110, 110a, 120, and 210 having a collective patterned three-dimensional stacked structure with an increased integration degree, and a method for manufacturing the same can be provided.

At this time, in step S140 mentioned above, as described above in regard to FIG. 7C, a spacer may be formed on the side surface of the mask material formed with a width of F that is the minimum feature size of the lithography to narrow the spacing between mask materials. Thereby, the width of the portion not covered with the mask materials can be narrower than F. Thereby, the width of the slit can be made 0.5 F, for example.

Furthermore, in the case where the spacing between the through holes adjacent to each other in the major axis direction XA is F and the adjacent first and second through holes H1 and H2 share the selection gate SG similar to the nonvolatile semiconductor memory device 110, the upper-layer and lower-layer selection gates SGA and SGB are provided. In this case, the method in which a resist pattern is provided twice in different regions and ion implantation is performed into each of the regions may be used as described above in regard to FIGS. 8A and 8B, between step S150 and step S160 mentioned above.

In other words, after the formation of the hole-dividing-insulating-layer IL (step S150), a first ion implantation and a second ion implantation may be performed. The first ion implantation is performed into the semiconductor pillar SP (the first and second semiconductor pillars SP1 and SP2) corresponding to one (for example, the first through hole H1) of the through holes H0 adjacent to each other in the major axis direction XA. The second ion implantation is performed into the semiconductor pillar SP (the third and fourth semiconductor pillars SP3 and SP4) corresponding to the other (the second through hole H2) of the through holes H0 adjacent to each other in the major axis direction XA, under different conditions from the first ion implantation.

Thereby, even in the case where the adjacent first and second through holes H1 and H2 share the selection gate SG similar to the nonvolatile semiconductor memory device 110, each memory cell can be distinctly selected by the upper-layer and lower-layer selection gates SGA and SGB.

Furthermore, in the case where the inter-hole-dividing-insulating-film WIL that divides the first and second electrode film regions WLR1 and WLR2 is provided between the adjacent first and second through holes H1 and H2 similar to the nonvolatile semiconductor memory device 120, the method described in regard to FIG. 14C, for example, may be employed.

Specifically, after step S130 in which the charge storage layer and the semiconductor material are buried in the through hole H0, the inter-hole slit WSL that divides the stacked body ML in a plane (e.g. the Y-Z plane) including a direction (e.g. the Y direction) perpendicular to the major axis direction XA of the oblate circle of the through hole H0 and the stacking direction (e.g. the Z direction) of the stacked body ML may be formed between the first and second through holes H1 and H2 adjacent to each other in the major axis direction XA, and an insulating film may be buried in the inter-hole slit WSL to form the inter-hole-dividing-insulating-film WIL.

Here, the inter-hole slit WSL and the inter-hole-dividing-insulating-film WIL can be configured to have a width of, for example, 0.5 F that is narrower than F, by forming a spacer on the side surface of the mask material formed with a width of F that is the minimum feature size during the formation of the inter-hole slit WSL and the inter-hole-dividing-insulating-film WIL.

As described above, according to the nonvolatile semiconductor memory device and the method for manufacturing the same according to the embodiments of the invention, the channel of the NAND strings can be caused to have a curvature by dividing the through hole having an oblate circle shape, and the integration degree can be increased while improving the performance of cell transistor.

In the specification of the application, "perpendicular" and "parallel" may include not only a strictly perpendicular state and a strictly parallel state, respectively, but also a variation and the like during the manufacturing process and the like, and a substantially perpendicular state and a substantially parallel state are sufficient.

Hereinabove, embodiments of the invention are described with reference to specific examples. However, the invention is not limited to these specific examples. For example, one skilled in the art may appropriately select specific configurations of components of the nonvolatile semiconductor memory device such as the semiconductor substrate, the electrode film, the insulating film, the stacked body, the charge storage layer, the charge storage layer stacked body, the word line, the bit line, the source line, the insulating layer, the transistor, the selection gate, and the connecting section from known art and similar practice the invention; and such practice is included in the scope of the invention to the extent that similar effects thereto are obtained.

Further, any two or more components of the specific examples may be combined within the extent of technical feasibility. Such combination is included in the scope of the invention to the extent that the spirit of the invention is included.

Moreover, all nonvolatile semiconductor memory devices and methods for manufacturing the same that can be obtained by an appropriate design modification by one skilled in the art based on the nonvolatile semiconductor memory device and the method for manufacturing the same described above as embodiments of the invention also are within the scope of the invention to the extent that the spirit of the invention is included.

Furthermore, one skilled in the art may arrive at various alterations and modifications within the idea of the invention. Such alterations and modifications should be seen as within the scope of the invention. For example, one skilled in the art may appropriately perform an addition, deletion or design modification of a component, or an addition, omission or condition alteration of a process in the embodiments described above. Such practice is included in the scope of the invention to the extent that the spirit of the invention is included.

The invention claimed is:

1. A nonvolatile semiconductor memory device comprising:
   a semiconductor substrate;
   a stacked body provided on the semiconductor substrate, the stacked body having electrode films and insulating films being alternately stacked;
   a first semiconductor pillar and a second semiconductor pillar provided inside a first through hole penetrating through the stacked body in a stacking direction of the stacked body, the first through hole having a first cross section of a first oblate circle, the first cross section being cut in a direction perpendicular to the stacking direction, the first semiconductor pillar facing the second semiconductor pillar in a first major axis direction of the first oblate circle, the first semiconductor pillar and the second semiconductor pillar extending in the stacking direction, the first semiconductor pillar having a first end provided on a side of the semiconductor substrate, the second semiconductor pillar having a second end provided on the side of the semiconductor substrate;
   a first charge storage layer provided between the electrode films and the first semiconductor pillar;
   a second charge storage layer provided between the electrode films and the second semiconductor pillar;
   a connection portion connecting the first end with the second end, the connection portion including a material same as a material included in the first semiconductor pillar and the second semiconductor pillar, the connection portion being not electrically connected to the semiconductor substrate; and a first hole-dividing-insulating-layer provided between the first semiconductor pillar and the second semiconductor pillar.

2. The device according to claim 1, wherein a length of the first through hole in the first major axis direction is substantially twice a length of the first through hole along a minor axis direction orthogonal to the first major axis direction.

3. The device according to claim 2, wherein
a length of the first semiconductor pillar along the first major axis direction and a length of the second semiconductor pillar along the first major axis direction are substantially 0.75 times a length of the first through hole along the minor axis direction and
a distance between closest sides of the first semiconductor pillar and the second semiconductor pillar is substantially 0.5 times a length of the first through hole along the minor axis direction.

4. The device according to claim 1, wherein a surface of the first semiconductor pillar along the stacking direction excluding a side facing the second semiconductor pillar of the first semiconductor pillar includes a curved surface concave on the side.

5. The device according to claim 1, wherein each of the electrode films is divided in a plane perpendicular to the stacking direction, and an electric potential of a portion of the electrode films facing the first semiconductor pillar is different from an electric potential of a portion of the electrode films facing the second semiconductor pillar.

6. The device according to claim 1, further comprising:
a third semiconductor pillar and a fourth semiconductor pillar provided inside a second through hole adjacent to the first through hole in the first major axis direction, the second through hole penetrating through the stacked body in the stacking direction, the second through hole having a second cross section of a second oblate circle having a second major axis direction parallel to the first major axis direction, the second cross section being cut in the direction perpendicular to the stacking direction, the third semiconductor pillar facing the fourth semiconductor pillar in the second major axis direction, the third semiconductor pillar and the fourth semiconductor pillar extending in the stacking direction;
a third charge storage layer provided between the electrode films and the third semiconductor pillar;
a fourth charge storage layer provided between the electrode films and the fourth semiconductor pillar; and
a second hole-dividing-insulating-layer provided between the third semiconductor pillar and the fourth semiconductor pillar.

7. The device according to claim 6, wherein a distance between closest sides of the first through hole and the second through hole along the first major axis direction is substantially equal to a length of the first through hole along a minor axis direction orthogonal to the first major axis direction.

8. The device according to claim 6, further comprising:
a fifth semiconductor pillar and a sixth semiconductor pillar provided inside a third through hole adjacent to the first through hole in a minor axis direction perpendicular to the first major axis direction, the third through hole penetrating through the stacked body in the stacking direction, the third through hole having a third cross section of a third oblate circle having a third major axis direction parallel to the first major axis direction, the third cross section being cut in the direction perpendicular to the stacking direction, the fifth semiconductor pillar facing the sixth semiconductor pillar in the third major axis direction, the fifth semiconductor pillar and the sixth semiconductor pillar extending in the stacking direction;
a fifth charge storage layer provided between the electrode films and the fifth semiconductor pillar; and
a sixth charge storage layer provided between the electrode films and the sixth semiconductor pillar.

9. The device according to claim 8, wherein a distance between closest sides of the first through hole and the third through hole along the minor axis direction is substantially equal to a length of the first through hole along the minor axis direction.

10. The device according to claim 6, wherein each of the electrode films is divided in a plane perpendicular to the stacking direction, a portion of the electrode films facing the first semiconductor pillar and a portion of the electrode films facing the fourth semiconductor pillar are set at a first electric potential, and a portion of the electrode films facing the second semiconductor pillar and a portion of the electrode films facing the third semiconductor pillar are set at a second electric potential different from the first electric potential.

11. The device according to claim 6, wherein each of the electrode films is divided in a plane perpendicular to the stacking direction, a portion of the electrode films facing the first semiconductor pillar is set at a first electric potential, a portion of the electrode films facing the second semiconductor pillar and a portion of the electrode films facing the third semiconductor pillar are set at a second electric potential different from the first electric potential, and a portion of the electrode films facing the fourth semiconductor pillar is set at a third electric potential different from both the first electric potential and the second electric potential.

12. The device according to claim 1, further comprising:
a third semiconductor pillar and a fourth semiconductor pillar provided inside a second through hole adjacent to the first through hole in the first major axis direction, the second through hole penetrating through the stacked body in the stacking direction, the second through hole having a second cross section of a second oblate circle having a second major axis direction parallel to the first major axis direction, the second cross section being cut in the direction perpendicular to the stacking direction, the third semiconductor pillar facing the fourth semiconductor pillar in the second major axis direction, the third semiconductor pillar and the fourth semiconductor pillar extending in the stacking direction;
a third charge storage layer provided between the electrode films and the third semiconductor pillar;
a fourth charge storage layer provided between the electrode films and the fourth semiconductor pillar;
a first selection gate transistor provided at an end portion on a side of the first and second semiconductor pillars opposite to the semiconductor substrate and having a first threshold;
a second selection gate transistor provided between the first selection gate transistor and the stacked body with respect to the first and second semiconductor pillars and having a second threshold different from the first threshold;
a third selection gate transistor provided at an end portion on a side of the third and fourth semiconductor pillars opposite to the semiconductor substrate and having a third threshold same as the second threshold; and a fourth selection gate transistor provided between the third selection gate transistor and the stacked body with respect to the third and fourth semiconductor pillars and having a fourth threshold same as the first threshold.

13. The device according to claim 12, wherein the first threshold and the fourth threshold are lower than the second threshold and the third threshold.

14. The device according to claim 1, further comprising:
a third semiconductor pillar and a fourth semiconductor pillar provided inside a second through hole adjacent to the first through hole in the first major axis direction, the second through hole penetrating through the stacked body in the stacking direction, the second through hole having a second cross section of a second oblate circle having a second major axis direction parallel to the first major axis direction, the second cross section being cut in the direction perpendicular to the stacking direction, the third semiconductor pillar facing the fourth semiconductor pillar in the second major axis direction, the third semiconductor pillar and a fourth semiconductor pillar extending in the stacking direction;
a third charge storage layer provided between the electrode films and the third semiconductor pillar;
a fourth charge storage layer provided between the electrode films and the fourth semiconductor pillar; and
an inter-hole-dividing-insulating-film provided between the first through hole and the second through hole, and dividing the electrode films into a region facing the first through hole and a region facing the second through hole.

15. The device according to claim 14, wherein a length of the inter-hole-dividing-insulating-film along the major axis direction is substantially 0.5 times a length of the first through hole along a minor axis direction orthogonal to the first major axis direction.

16. The device according to claim 15, wherein a length of the first through hole in the first major axis direction is not less than 1.5 times and less than 3. times a length of the first through hole along the minor axis direction.

17. The device according to claim 1, further comprising a back gate provided between the semiconductor substrate and the stacked body,
the first and second semiconductor pillars being connected to each other in a portion of the back gate.

* * * * *